US012775206B2

(12) United States Patent
Goda et al.

(10) Patent No.: US 12,775,206 B2
(45) Date of Patent: Oct. 27, 2026

(54) REFLECTIVE PHOTOMASK BLANK AND REFLECTIVE PHOTOMASK

(71) Applicant: TEKSCEND PHOTOMASK CORP., Tokyo (JP)

(72) Inventors: Ayumi Goda, Tokyo (JP); Yuto Yamagata, Tokyo (JP); Hideaki Nakano, Tokyo (JP); Kenjiro Ichikawa, Tokyo (JP)

(73) Assignee: TEKSCEND PHOTOMASK CORP., Tokyo (JP)

( * ) Notice: Subject to any disclaimer, the term of this patent is extended or adjusted under 35 U.S.C. 154(b) by 673 days.

(21) Appl. No.: 17/921,089

(22) PCT Filed: Apr. 28, 2021

(86) PCT No.: PCT/JP2021/017056
§ 371 (c)(1),
(2) Date: Oct. 24, 2022

(87) PCT Pub. No.: WO2021/221123
PCT Pub. Date: Nov. 4, 2021

(65) Prior Publication Data

US 2023/0143851 A1 May 11, 2023

(30) Foreign Application Priority Data

Apr. 30, 2020 (JP) ................................ 2020-080646
Jun. 30, 2020 (JP) ................................ 2020-113230

(51) Int. Cl.
*G03F 1/24* (2012.01)
*G03F 1/56* (2012.01)
*G03F 1/58* (2012.01)

(52) U.S. Cl.
CPC ................. *G03F 1/24* (2013.01); *G03F 1/58* (2013.01); *G03F 1/56* (2013.01)

(58) Field of Classification Search
CPC .................................... G03F 1/24; G03F 1/58
See application file for complete search history.

(56) References Cited

U.S. PATENT DOCUMENTS 7,604,906 B1 10/2009 Volk et al.
8,288,062 B2 10/2012 Hayashi et al.
(Continued)

FOREIGN PATENT DOCUMENTS

EP 4293422 A1 12/2023
JP S52-139375 A 11/1977
(Continued)

OTHER PUBLICATIONS

International Preliminary Report on Patentability mailed Nov. 10, 2022 for International Application No. PCT/JP2021/017056, with translation, 6 pages.
(Continued)

*Primary Examiner* — Stewart A Fraser
(74) *Attorney, Agent, or Firm* — Squire Patton Boggs (US) LLP

(57) ABSTRACT

The present invention is intended to provide a reflective photomask blank and a reflective photomask that have high hydrogen radical resistance and minimize a shadowing effect to improve transferability. A reflective photomask blank (10) according to the present embodiment includes a substrate (1), a reflective portion (7), and a low reflective portion (8). The low reflective portion (8) includes an absorption layer (4) and an outermost layer (5). The absorption layer (4) includes a total of 50 atomic % or more of one or more selected from a first material group. The outermost layer (5) includes a total of 80 atomic % or more of at least one or more selected from a second material group. The first material group includes indium, tin, tellurium, cobalt, nickel, platinum, silver, copper, zinc, bismuth, and oxides, nitrides, and oxynitrides thereof. The second material group
(Continued)

includes tantalum, aluminum, ruthenium, molybdenum, zirconium, titanium, zinc, vanadium, and oxides, nitrides, oxynitrides, and indium oxides thereof.

7 Claims, 8 Drawing Sheets

(56) References Cited

U.S. PATENT DOCUMENTS

| | | | | |
|---|---|---|---|---|
| 8,685,632 | B2 | 4/2014 | Kempen et al. | |
| 8,962,220 | B2 * | 2/2015 | Matsuo | G03F 1/24 430/5 |
| 9,075,316 | B2 * | 7/2015 | Singh | G03F 1/24 |
| 2005/0208389 | A1 * | 9/2005 | Ishibashi | B82Y 10/00 430/5 |
| 2007/0128528 | A1 | 6/2007 | Hess et al. | |
| 2011/0143288 | A1 | 6/2011 | Kempen et al. | |
| 2012/0107733 | A1 | 5/2012 | Hayashi et al. | |
| 2013/0300432 | A1 | 11/2013 | Chen | |
| 2014/0205936 | A1 * | 7/2014 | Kodera | G03F 1/38 430/5 |
| 2015/0198874 | A1 * | 7/2015 | Ikuta | G03F 1/78 430/5 |
| 2017/0131627 | A1 | 5/2017 | Hassan et al. | |
| 2017/0269468 | A1 * | 9/2017 | Kondo | G03F 1/24 |
| 2018/0031964 | A1 | 2/2018 | Jindal | |
| 2019/0079383 | A1 * | 3/2019 | Ikebe | G03F 1/32 |
| 2019/0086791 | A1 | 3/2019 | Tanabe | |
| 2019/0113836 | A1 | 4/2019 | Sun et al. | |
| 2019/0384156 | A1 | 12/2019 | Tanabe | |
| 2020/0096858 | A1 | 3/2020 | Lin | |
| 2020/0096875 | A1 | 3/2020 | Van De et al. | |
| 2020/0310244 | A1 * | 10/2020 | Nakagawa | G03F 1/24 |
| 2021/0247688 | A1 * | 8/2021 | Kozakai | G03F 1/58 |
| 2021/0311382 | A1 * | 10/2021 | Kataoka | G03F 1/54 |
| 2023/0143851 | A1 | 5/2023 | Goda et al. | |
| 2024/0126160 | A1 | 4/2024 | Goda et al. | |

FOREIGN PATENT DOCUMENTS

| | | | |
|---|---|---|---|
| JP | 2006-190900 | A | 7/2006 |
| JP | 2007-250613 | A | 9/2007 |
| JP | 2007-273678 | A | 10/2007 |
| JP | 2008-041740 | A | 2/2008 |
| JP | 2011-176162 | A | 9/2011 |
| JP | 2011-530823 | A | 12/2011 |
| JP | 2013-238843 | A | 11/2013 |
| JP | 2014-045075 | A | 3/2014 |
| JP | 2017-521713 | A | 8/2017 |
| JP | 2017-525998 | A | 9/2017 |
| JP | 6408790 | B2 | 10/2018 |
| JP | 2019-056898 | A | 4/2019 |
| JP | 2019-139085 | A | 8/2019 |
| JP | 2021-173977 | A | 11/2021 |
| JP | 2022-011843 | A | 1/2022 |
| SG | 11202113285V | A | 12/2021 |
| WO | WO 1997/044709 | A1 | 11/1997 |
| WO | WO 1997/044710 | A1 | 11/1997 |
| WO | WO 2011/004850 | A1 | 1/2011 |
| WO | WO 2014/050891 | A1 | 4/2014 |

OTHER PUBLICATIONS

International Search Report mailed Jul. 13, 2021 for International Application No. PCT/JP2021/017056, with translation, 7 pages.
Search Report and Written Opinion dated Nov. 14, 2024, for Singapore Patent Application No. 11202254520R, 11 pages.
Supplementary Euoprean Search Reported dated Jul. 11, 2024, for European Patent Application No. 21796240.6, 17 pages.

* cited by examiner

REFLECTIVE PHOTOMASK BLANK AND REFLECTIVE PHOTOMASK

CROSS-REFERENCE

This application is a National Stage filing under 35 U.S.C. § 371 of International Patent Application No. PCT/JP2021/017056, filed Apr. 28, 2021, which claims the benefit of and priority to Japanese Patent Application No. 2020-080646, filed Apr. 30, 2020, and further claims the benefit of and priority to JP Application No. 2020-113230, filed Jun. 30, 2020, the contents of all of which are hereby incorporated by reference in their entireties for all purposes.

TECHNICAL FIELD

The present invention relates to a reflective photomask and a reflective photomask blank for producing the same.

BACKGROUND ART

In manufacturing processes for semiconductor devices, a demand for finer photolithography technology is increasing along with miniaturization of semiconductor devices. The minimum resolution dimension of a transfer pattern in photolithography largely depends on the wavelength of an exposure light source, and the shorter the wavelength, the smaller the minimum resolution dimension can be. Therefore, in the manufacturing processes for semiconductor devices, exposure light sources using conventional ArF excimer laser light with a wavelength of 193 nm have been replaced by those using extreme ultra violet (EUV) light with a wavelength of 13.5 nm.

EUV light has short wavelengths and therefore is absorbed by most substances at high rate. For this reason, photomasks for EUV exposure (EUV photomasks) are reflective masks, unlike conventional transmission masks (see, for example, PTL 1, 2, and 3). PTL 1 discloses a reflective exposure mask for use in EUV lithography in which two or more material layers are periodically deposited on a base substrate to form a multi-layer film, and a pattern composed of a metal film including nitriding or a mask pattern composed of a deposited structure of a metal nitride film and a metal film is formed on the multi-layer film. Additionally, PTL 2 discloses a reflective EUV mask including a phase control film as an absorber film formed on a multi-layer reflective film and a deposited structure formed on the phase control film, in which material layers with a high refractive index and a low refractive index are alternately deposited. In addition, PTL 3 discloses an EUV photomask obtained by forming a reflective layer composed of a multi-layer film in which molybdenum (Mo) layers and silicon (Si) layers are alternately deposited on a glass substrate, forming a light absorption layer containing tantalum (Ta) as a main component on the reflective layer, and forming a pattern on the light absorption layer.

As described above, since EUV lithography cannot use a refractive optical system utilizing light transmission, the optical system member of an exposure apparatus is not a lens but a mirror. Due to this, there is a problem where incident light and reflected light on an EUV photomask (reflective photomask) cannot be designed coaxially. Usually, EUV lithography employs a method in which EUV light is incident with an optical axis inclined by 6 degrees from a vertical direction of the EUV photomask, and reflected light reflected at an angle of minus 6 degrees is applied to a semiconductor substrate.

Thus, in EUV lithography, the optical axis is inclined, which may cause a so-called “shadowing effect” problem where EUV light incident on the EUV photomask creates a shadow of a mask pattern (absorption layer pattern) of the EUV photomask, and thereby transfer performance is deteriorated.

To solve this problem, PTL 1 discloses a method in which by employing materials having an extinction coefficient k for EUV of 0.03 or more as materials forming the phase control film and the low refractive index material layers, it is possible to form a thinner absorber layer (a film thickness of 60 nm or less) than conventional ones, resulting in a reduced shadowing effect. Additionally, PTL 2 discloses a method in which a compound material having a high absorption (extinction coefficient k) of EUV light is employed for the conventional absorption layer mainly containing Ta or the phase shift film to reduce the film thickness thereof, thereby reducing the shadowing effect.

Furthermore, in current EUV exposure apparatuses, cleaning with hydrogen radicals is often performed in order to prevent in-chamber contamination due to mixing of impurities, so-called contamination. Photomasks are frequently exposed to hydrogen radical environments, so that a photomask less resistant to hydrogen radicals may have a shorter life. Therefore, photomasks are required to be formed of compound materials that are highly resistant to hydrogen radicals.

However, the methods of PTL 1 and 2 do not mention hydrogen radical resistance, and it is not clarified whether the photomasks can withstand long-term use. Additionally, although PTL 2 describes a method of forming a low reflective film (low reflective portion) against EUV light on the absorption layer, there is no mention at all of an increased shadowing effect due to a total film thickness of the absorption layer and the low reflective film increased by forming the low reflective portion. Thus, it is not clear whether the EUV photomask has high transferability.

In addition, some of current EUV mask blanks use a film mainly containing tantalum (Ta), which has a film thickness of from 60 nm to 90 nm, as a light absorption layer. When an EUV mask produced using such a mask blank is used to perform exposure for pattern transfer, contrast reduction may occur at an edge portion in the shadow of a mask pattern depending on a relationship between an incident direction of EUV light and an orientation of the mask pattern. This may cause problems such as an increased line edge roughness of a transfer pattern on a semiconductor substrate and an inability to form a line width into a targeted dimension, which may deteriorate transfer performance.

Therefore, studies have been made on reflective photomask blanks in which in a light absorption layer, tantalum (Ta) is changed to a material having a high EUV absorption (extinction coefficient) or a material having a high EUV absorption is added to tantalum (Ta). For example, PTL 4 describes a reflective photomask blank including a light absorption layer formed of a material including 50 atomic % (at %) or more of Ta as a main component and further including at least one element selected from Te, Sb, Pt, I, Bi, Ir, Os, W, Re, Sn, In, Po, Fe, Au, Hg, Ga, and Al.

Additionally, the mirror is known to be contaminated by by-products (for example, Sn), carbon, and the like produced by EUV. Accumulation of contaminants on the mirror reduces the reflectance of a mirror surface, lowering throughput of a lithographic apparatus. To solve this problem, PTL 5 discloses a method for removing a contaminant from a mirror by generating a hydrogen radical in an apparatus and causing the hydrogen radical to react with the contaminant.

However, in the reflective photomask blank described in PTL 4, the resistance of the light absorption layer to hydrogen radicals (hydrogen radical resistance) has not been considered. Therefore, a transfer pattern (mask pattern) formed on the light absorption layer by introduction into an EUV exposure apparatus cannot be maintained stably, which may result in deteriorated transferability.

CITATION LIST

Patent Literature

PTL 1: JP Pat. No. 6408790
PTL 2: WO 2011/004850
PTL 3: JP 2011-176162 A
PTL 4: JP 2007-273678 A
PTL 5: JP 2011-530823 A

SUMMARY OF INVENTION

Technical Problem

It is an object of the present invention to provide an EUV photomask blank (reflective photomask blank) and an EUV photomask (reflective photomask) that have high hydrogen radical resistance and that have improved transferability by minimizing the shadowing effect.

Solution to Problem

In order to achieve the above object, a reflective photomask blank according to one aspect of the present invention is a reflective photomask blank for producing a reflective photomask for pattern transfer using extreme ultraviolet light as a light source, the reflective photomask blank including a substrate, a reflective portion formed on the substrate to reflect incident light, and a low reflective portion formed on the reflective portion to absorb the incident light, wherein the low reflective portion is a deposited structure of at least two or more layers including an absorption layer and an outermost layer, in which at least one layer of the absorption layer includes a total of 50 atomic % or more of one or more selected from a first material group, and the outermost layer includes a total of 80 atomic % or more of at least one or more selected from a second material group, the first material group includes indium (In), tin (Sn), tellurium (Te), cobalt (Co), nickel (Ni), platinum (Pt), silver (Ag), copper (Cu), zinc (Zn), bismuth (Bi), and oxides, nitrides, and oxynitrides thereof, and the second material group includes tantalum (Ta), aluminum (Al), ruthenium (Ru), molybdenum (Mo), zirconium (Zr), titanium (Ti), zinc (Zn), vanadium (V), and oxides, nitrides, oxynitrides, and indium oxides ($In_xO_y$ (y>1.5x)) thereof.

Additionally, a reflective photomask blank according to another aspect of the present invention is a reflective photomask blank for producing a reflective photomask for pattern transfer using extreme ultraviolet light as a light source, the reflective photomask blank including a substrate, a reflective portion formed on the substrate to reflect incident light, and a low reflective portion formed on the reflective portion to absorb the incident light, wherein the low reflective portion is a deposited structure of at least two or more layers including an absorption layer and an outermost layer, at least one layer of the absorption layer including indium oxide, and the outermost layer includes any one or more of tantalum (Ta), aluminum (Al), silicon (Si), palladium (Pd), zirconium (Zr), hafnium (Hf), niobium (Nb), chromium (Cr), platinum (Pt), yttrium (Y), nickel (Ni), lead (Pb), titanium (Ti), gallium (Ga), bismuth (Bi), and oxides, nitrides, fluorides, borides, oxynitrides, oxyborides, and oxynitride borides thereof.

In addition, the absorption layer may be formed of a material containing a total of 50 atomic % or more of indium (In) and oxygen (O), in which an atomic number ratio (O/In) of oxygen (O) to indium (In) may be from 1 to 1.5.

Additionally, the absorption layer may further include any one or more of beryllium (Be), calcium (Ca), scandium (Sc), vanadium (V), manganese (Mn), iron (Fe), cobalt (Co), copper (Cu), ruthenium (Ru), silver (Ag), barium (Ba), iridium (Ir), gold (Au), silicon (Si), germanium (Ge), hafnium (Hf), tantalum (Ta), aluminum (Al), palladium (Pd), zirconium (Zr), niobium (Nb), chromium (Cr), platinum (Pt), yttrium (Y), nickel (Ni), lead (Pb), titanium (Ti), gallium (Ga), tellurium (Te), tungsten (W), molybdenum (Mo), tin (Sn), and oxides, nitrides, fluorides, borides, oxynitrides, oxyborides, and oxynitride borides thereof.

Furthermore, the outermost layer may include any one or more of transition elements, bismuth (Bi), and oxides, nitrides, fluorides, borides, oxynitrides, oxyborides, and oxynitride borides thereof.

In addition, the absorption layer may be divided into a plurality of layers, and even when the absorption layer is divided into a plurality of layers, a total film thickness of the layers may be in a range of from 17 nm to 47 nm, and an optical density (OD) value may be 1.0 or more.

Additionally, even when the absorption layer is divided into a plurality of layers, the total film thickness of the layers may be in a range of from 17 nm to 45 nm.

Furthermore, the low reflective portion may have a film thickness of 60 nm or less, and the outermost layer may have a film thickness of 1.0 nm or more.

In order to achieve the above object, a reflective photomask according to one aspect of the present invention is a reflective photomask for pattern transfer using extreme ultraviolet light as a light source, the reflective photomask including a substrate, a reflective portion formed on the substrate to reflect incident light, and a low reflective portion formed on the reflective portion to absorb the incident light, wherein the low reflective portion is a deposited structure of at least two or more layers including an absorption layer and an outermost layer, in which at least one layer of the absorption layer includes a total of 50 atomic % or more of one or more selected from a first material group, and the outermost layer includes a total of 80 atomic % or more of at least one or more selected from a second material group, the first material group including indium (In), tin (Sn), tellurium (Te), cobalt (Co), nickel (Ni), platinum (Pt) silver (Ag), copper (Cu), zinc (Zn), bismuth (Bi), and oxides, nitrides, and oxynitrides thereof, and the second material group including tantalum (Ta), aluminum (Al), ruthenium (Ru), molybdenum (Mo), zirconium (Zr), titanium (Ti), zinc (Zn), vanadium (V), and oxides, nitrides, oxynitrides, and indium oxides ($In_xO_y$ (y>1.5x)) thereof.

In addition, a reflective photomask according to another aspect of the present invention is a reflective photomask for pattern transfer using extreme ultraviolet light as a light source, the reflective photomask including a substrate, a reflective portion formed on the substrate to reflect incident light, and a low reflective portion formed on the reflective portion to absorb the incident light, wherein the low reflective portion is a deposited structure of at least two or more layers including an absorption layer and an outermost layer, and at least one layer of the absorption layer includes indium oxide, and the outermost layer including any one or more of tantalum (Ta), aluminum (Al), silicon (Si), palladium (Pd), zirconium (Zr), hafnium (Hf), niobium (Nb), chromium (Cr), platinum (Pt), yttrium (Y), nickel (Ni), lead (Pb), titanium (Ti), gallium (Ga), bismuth (Bi), and oxides, nitrides, fluorides, borides, oxynitrides, oxyborides, and oxynitride borides thereof.

Additionally, the absorption layer may be formed of a material containing a total of 50 atomic % or more of indium (In) and oxygen (O), in which an atomic number ratio (O/In) of oxygen (O) to indium (In) may be from 1 to 1.5.

Furthermore, the absorption layer may further include any one or more of beryllium (Be), calcium (Ca), scandium (Sc), vanadium (V), manganese (Mn), iron (Fe), cobalt (Co), copper (Cu), ruthenium (Ru), silver (Ag), barium (Ba), iridium (Ir), gold (Au), silicon (Si), germanium (Ge), hafnium (Hf), tantalum (Ta), aluminum (Al), palladium (Pd), zirconium (Zr), niobium (Nb), chromium (Cr), platinum (Pt), yttrium (Y), nickel (Ni), lead (Pb), titanium (Ti), gallium (Ga), tellurium (Te), tungsten (W), molybdenum (Mo), tin (Sn), and oxides, nitrides, fluorides, borides, oxynitrides, oxyborides, and oxynitride borides thereof.

In addition, the outermost layer may include any one or more of transition elements, bismuth (Bi), and oxides, nitrides, fluorides, borides, oxynitrides, oxyborides, and oxynitride borides thereof.

Additionally, the low reflective portion may have a film thickness of 60 nm or less, in which even when the absorption layer is divided into a plurality of layers, a total film thickness of each layer may be from 17 nm to 47 nm, and the outermost layer may have a film thickness of 1 nm or more.

Furthermore, even when the absorption layer is divided into a plurality of layers, the total film thickness of each layer may be from 17 nm to 45 nm.

Advantageous Effects of Invention

According to the one aspect of the present invention, forming the low reflective portion containing a compound material having high absorption of EUV and a compound material having high hydrogen radical resistance in the outermost layer allows for improved dimensional accuracy and shape accuracy of a pattern transferred onto a wafer and long-term use of the photomask. In other words, according to the aspects of the present invention, there can be provided an EUV photomask blank (reflective photomask blank) and an EUV photomask (reflective photomask) that have high hydrogen radical resistance and that have improved transferability by minimizing the shadowing effect.

DESCRIPTION OF EMBODIMENTS

Hereinafter, each configuration of a reflective photomask blank and a reflective photomask according to the present invention is described with reference to the drawings. However, the present invention is not limited to the embodiments below. Although the embodiments given below describe technologically preferable limitations in order to carry out the present invention, such limitations are not essential requirements of the present invention.

Figure 1:
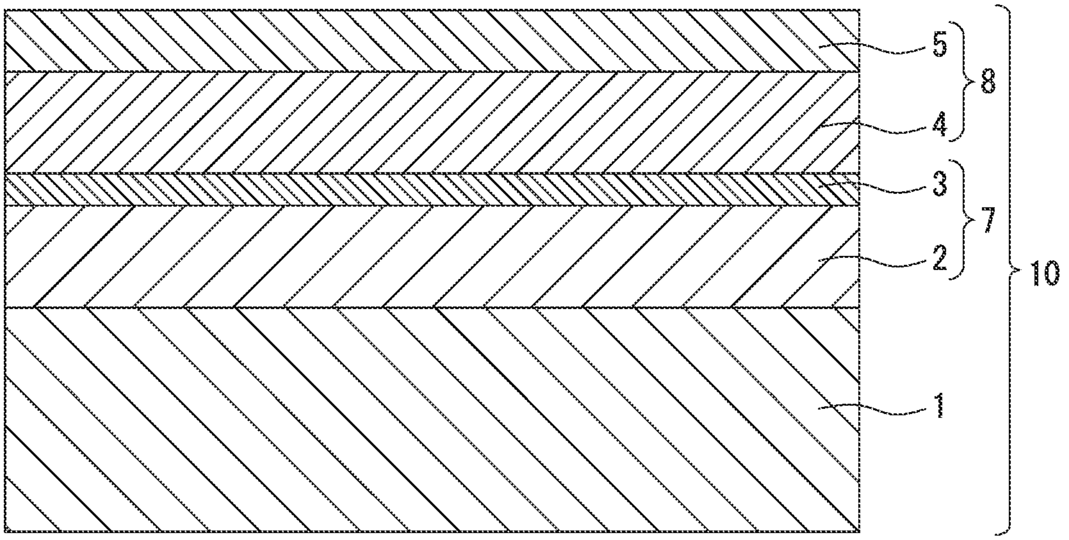
FIG. 1 is a schematic cross-sectional diagram illustrating the structure of a reflective photomask blank according to each embodiment of the present invention.
Figure 2:
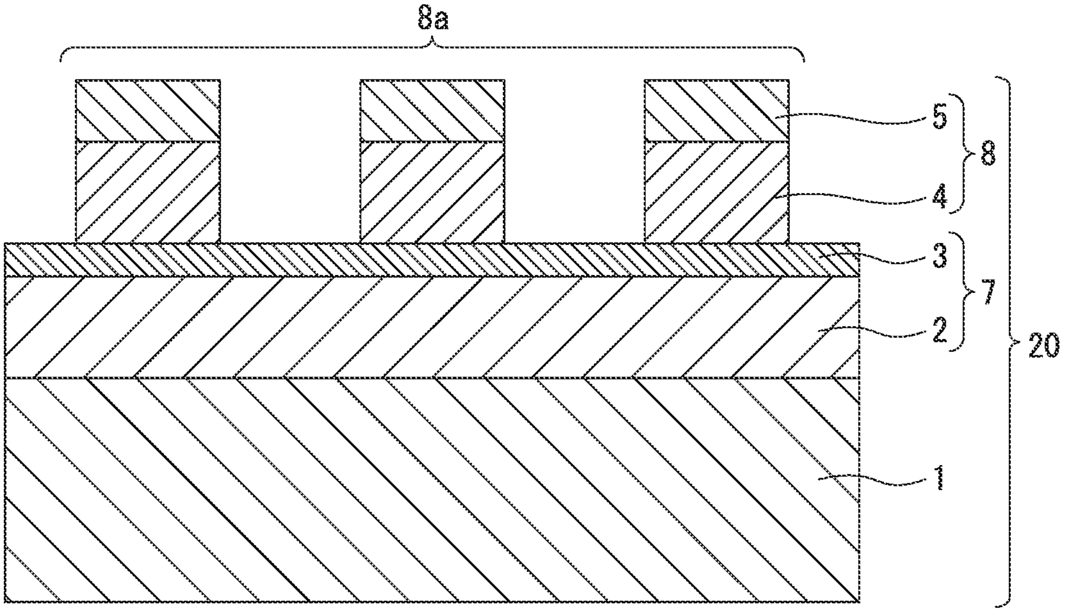
FIG. 2 is a schematic cross-sectional diagram illustrating the structure of a reflective photomask according to each embodiment of the present invention.

FIG. 1 is a schematic cross-sectional diagram illustrating the structure of a reflective photomask blank 10 according to each embodiment of the present invention. Additionally, FIG. 2 is a schematic cross-sectional diagram illustrating the structure of a reflective photomask 20 according to each embodiment of the present invention. Here, the reflective photomask 20 according to each embodiment of the present invention illustrated in FIG. 2 is formed by patterning a low reflective portion 8 of the reflective photomask blank 10 according to each embodiment of the present invention illustrated in FIG. 1.

Embodiment 1

(Overall Structure)

As illustrated in FIG. 1, the reflective photomask blank 10 according to the embodiment of the present invention includes a substrate 1, a multi-layer reflective film 2 formed on the substrate 1, and a capping layer 3 formed on the multi-layer reflective film 2. As a result, a reflective portion 7 including the multi-layer reflective film 2 and the capping layer 3 is formed on the substrate 1. The reflective photomask blank 10 according to the embodiment of the present invention includes the low reflective portion 8 on the reflective portion 7. The low reflective portion 8 includes at least two or more layers, one layer of which is an absorption layer 4, and an outermost layer 5 is provided on the absorption layer 4.

(Substrate)

As the substrate 1 according to the embodiment of the present invention, for example, a flat substrate made of silicon, synthetic quartz, or the like can be used. Alternatively, low thermal expansion glass containing titanium can be used for the substrate 1. However, the present invention is not limited to these materials as long as they have a low thermal expansion coefficient.

(Reflective Portion)

<Multi-Layer Reflective Film>

The multi-layer reflective film 2 according to each embodiment of the present invention can be any one that reflects EUV light (extreme ultraviolet light) that is exposure light. Preferably, the multi-layer reflective film 2 is a multi-layer reflective film made of a combination of materials having significantly different refractive indices for EUV light. The multi-layer reflective layer 2 is preferably formed, for example, by repeatedly depositing a layer of a combination of molybdenum (Mo) and silicon (Si) or molybdenum (Mo) and beryllium (Be) for about 40 cycles.

<Capping Layer>

The capping layer 3 according to each embodiment of the present invention is formed of a material having resistance to dry etching performed when forming a transfer pattern (mask pattern) on the absorption layer 4, and functions as an etching stopper preventing damage to the multi-layer reflective film 2 when etching and forming a low reflective portion pattern, which will be described later. The capping layer 3 is formed of, for example, ruthenium (Ru). Here, depending on the material of the multi-layer reflective film 2 and etching conditions, the capping layer 3 may not be formed. Additionally, although not illustrated, a backside conductive film can be formed on a surface of the substrate 1 not having the multi-layer reflective layer 2. The backside conductive film is a film for fixing the reflective photomask 20, which will be described later, by utilizing an electrostatic chuck principle when it is installed in an exposure apparatus.

(Low Reflective Portion)

The low reflective portion 8 according to each embodiment of the present invention is a layer in which a low reflective portion pattern 8*a* is formed by removing a part of the low reflective portion 8 of the reflective photomask blank 10, as illustrated in FIG. 2.

In EUV lithography, EUV light enters at an angle, and is reflected by the reflective portion 7. However, due to a shadowing effect in which the low reflective portion pattern 8*a* obstructs a light path, transfer performance onto a wafer (semiconductor substrate) may be deteriorated. The deterioration in the transfer performance is reduced by reducing the thickness of the low reflective portion 8 absorbing EUV light. In order to reduce the thickness of the low reflective portion 8, it is preferable to apply a material that has higher EUV light absorption than the conventional material, i.e., a material that has a high extinction coefficient k at the wavelength of 13.5 nm to the absorption layer 4.

<Absorption Layer>

Figure 3:
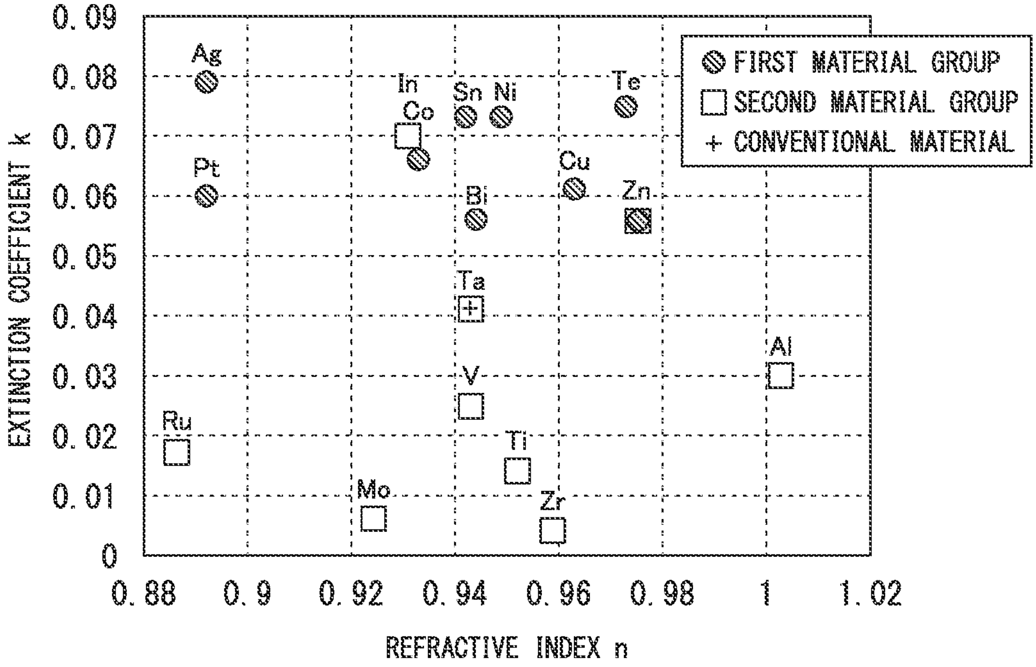
FIG. 3 is a map illustrating optical constants of metals included in a first material group and a second material group at a wavelength of EUV light.

The extinction coefficient k of tantalum (Ta), which is the main material of a conventional absorption layer 4, is 0.041. Using a compound material having an extinction coefficient k higher than that can reduce the thickness of the absorption layer 4 (low reflective portion 8) as compared with the conventional one. FIG. 3 illustrates a graph of optical constants of tantalum (Ta) and a first material group, which will be described later. FIG. 3 indicates that each of materials included in the first material group has a higher extinction coefficient k than the conventional material, and therefore can reduce shadowing effects.

However, indium (In) is included in a second material group, which will be described later, only when it is an indium oxide ($In_xO_y$ (y>1.5x)).

Here, the "first material group" in the present embodiment means a material group including indium (In), tin (Sn), tellurium (Te), cobalt (Co), nickel (Ni), platinum (Pt), silver (Ag), copper (Cu), zinc (Zn), bismuth (Bi), and oxides, nitrides, and oxynitrides thereof. In other words, at least one layer forming the absorption layer 4 in the present embodiment includes a total of 50 atomic % or more of one or more selected from the material group including indium (In), tin (Sn), tellurium (Te), cobalt (Co), nickel (Ni), platinum (Pt), silver (Ag), copper (Cu), zinc (Zn), bismuth (Bi), and oxides, nitrides, and oxynitrides thereof. The materials constituting the first material group have high extinction coefficients k. Accordingly, when at least one layer forming the absorption layer 4 is formed of one or more materials constituting the first material group, transfer performance can be improved.

Among the first material group, tin (Sn) is particularly preferable because it becomes more thermally stable by being oxidized, and also can be easily processed by a reactive gas.

For the absorption layer 4 of the present embodiment, a compound material prepared by mixing at least one material selected from the above-mentioned first material group and another material can be used. In order to reduce the shadowing effect, the total film thickness (overall film thickness) of the absorption layer 4 is preferably 47 nm or less. When the total film thickness (overall film thickness) of the absorption layer 4 exceeds 47 nm, pattern transfer may not be improved due to the shadowing effect. When the total film thickness (overall film thickness) of the absorption layer 4 is less than 17 nm, the OD value may be less than 1, so that pattern transfer may not be improved.

Additionally, a mixing ratio of the materials forming the absorption layer 4 of the present embodiment needs to be a mixing ratio calculated so that the OD value is 1 or more in order to maintain a contrast that allows for pattern transfer. A lower limit value of the mixing ratio of the materials forming the absorption layer 4 of the present embodiment depends on the optical constant of the other material to be mixed, and therefore cannot be determined unconditionally. However, in order to reduce the shadowing effect as compared with the conventional film, the compound material desirably contains at least 50 atomic % or more of one or more materials constituting the first material group.

Furthermore, in order to transfer a fine pattern, desired is high contrast between intensities of light reflected from each of the reflective portion 7 and the low reflective portion 8. Therefore, the OD value of the absorption layer 4 is more preferably 1.5 or more.

The absorption layer 4 is formed on the capping layer 3, for example, by sputtering. Preferably, a film quality of the absorption layer 4 is sufficiently amorphous for roughness and in-plane dimensional uniformity of an absorption layer pattern after etching, or in-plane uniformity of a transferred image. Therefore, the absorption layer 4 may be formed of a compound material that contains less than 50 atomic % of at least one material selected from boron (B), nitrogen (N), silicon (Si), germanium (Ge), hafnium (Hf), and oxides, nitrides, and oxynitrides thereof.

The absorption layer 4 may be formed by mixing another material, in addition to the first material group, for the purposes of, for example, improving amorphousness, improving cleaning resistance, preventing mixing, improving contrast of inspection light, phase shift, and the like.

Additionally, the absorption layer 4 may be of a single-layer structure or a layer structure divided into a plurality of layers. When the absorption layer 4 has a layer structure divided into a plurality of layers, each of the layers may be formed with a different composition. For example, a lowermost layer of the absorption layer 4 may be formed of a material having a highest extinction coefficient k among the materials constituting the first material group, and the layers may be deposited such that the extinction coefficients k of the materials constituting the first material group become successively lower. Alternatively, the lowermost layer of the absorption layer 4 may be formed of a material having a lowest extinction coefficient k among the materials constituting the first material group, and the layers may be deposited such that the extinction coefficients k of the materials constituting the first material group become successively higher.

<Outermost Layer>

As described above, since photomasks are often exposed to hydrogen radical environments in EUV exposure apparatuses, it is necessary to extend the life of the photomasks by using compound materials having high hydrogen radical resistance.

Figure 4:
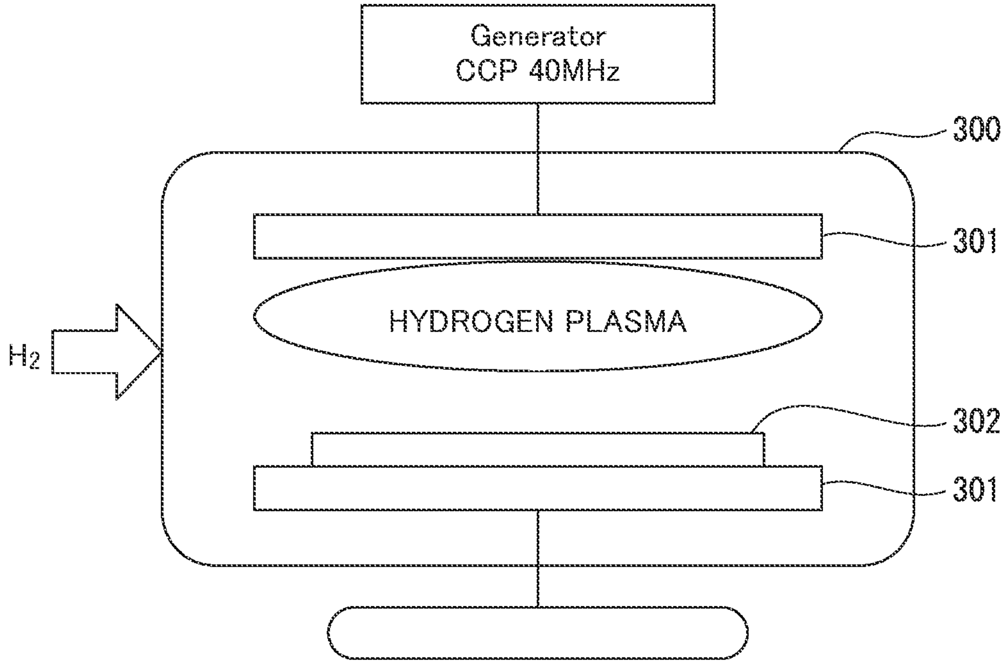
FIG. 4 is a conceptual diagram illustrating a hydrogen radical resistance evaluation method according to each embodiment of the present invention.

As illustrated in FIG. 4, in the present embodiment, compound materials having a film reduction rate of 0.1 nm/s or less in a hydrogen radical environment excited under conditions of a hydrogen flow rate of $10^{19}$ at/(cm$^2$s), a 40 MHz capacitively coupled plasma (CCP), and an inter-electrode distance of 18 mm are considered as those having high hydrogen radical resistance.

Note that evaluation of hydrogen radical resistance in the present embodiment is not limited to the above evaluation method. For example, materials having a film reduction rate of 0.1 nm/s or less in a hydrogen radical-rich environment in which hydrogen plasma is generated using microwave plasma with a power of 1 kw in a vacuum of 0.36 millibar (mbar) or less may be considered as those having high hydrogen radical resistance.

Here, regarding measured values of the film reduction rate, the difference between the above-described two methods is very small, and almost the same value can be obtained.

The outermost layer 5 includes a total of 80 atomic % or more of at least one or more selected from the second material group, which will be described later, and materials of the second material group are those satisfying the conditions of the materials having high radical resistance described above. As the compound material of the outermost layer 5, for example, another material in addition to the second material group can be mixed. However, in order not to reduce the radical resistance, the outermost layer 5 is desirably formed of a compound material containing at least 80 atomic % or more of the materials of the second material group.

Here, the "second material group" in the present embodiment means a material group including tantalum (Ta), aluminum (Al), ruthenium (Ru), molybdenum (Mo), zirconium (Zr), titanium (Ti), zinc (Zn), vanadium (V), and oxides, nitrides, oxynitrides, and indium oxides ($In_xO_y$ (y>1.5x)) thereof. In other words, the outermost layer 5 in the present embodiment includes a total of 80 atomic % or more of one or more selected from the material group including tantalum (Ta), aluminum (Al), ruthenium (Ru), molybdenum (Mo), zirconium (Zr), titanium (Ti), zinc (Zn), indium (In), and vanadium (V), and oxides, nitrides, and oxynitrides thereof.

The low reflective portion 8 has a combined film thickness of the absorption layer 4 and the outermost layer 5, so that there is a concern of an increased shadowing effect. Therefore, desirably, the total film thickness of the absorption layer 4 and the outermost layer 5 is 60 nm or less. Additionally, when a compound material having sufficient hydrogen radical resistance is used for the outermost layer 5, the film thickness of the outermost layer 5 is preferably 1.0 nm or more in order to obtain a stable film thickness distribution. Furthermore, in order to minimize the shadowing effect, the film thickness of the outermost layer 5 is preferably 10 nm or less.

The outermost layer 5 is formed on the absorption layer 4 by, for example, sputtering. Preferably, a film quality of the outermost layer 5 is sufficiently amorphous for roughness and in-plane dimensional uniformity of an outermost layer pattern after etching, or in-plane uniformity of a transferred image. Therefore, the outermost layer 5 may be formed of a compound material that contains at least one element selected from boron (B), nitrogen (N), germanium (Ge), hafnium (Hf), and oxides, nitrides, and oxynitrides thereof in a composition ratio of less than 20%.

Furthermore, in addition to the above material, the material forming the outermost layer 5 may be a material containing at least one element selected from, for example, beryllium (Be), calcium (Ca), scandium (Sc), vanadium (V), manganese (Mn), iron (Fe), cobalt (Co), copper (Cu), germanium (Ge), arsenic (As), strontium (Sr), molybdenum (Mo), technetium (Tc), ruthenium (Ru), rhodium (Rh), silver (Ag), barium (Ba), tungsten (W), rhenium (Re), osmium (Os), iridium (Ir), gold (Au), radium (Ra), and oxides, nitrides, fluorides, borides, oxynitrides, oxyborides, and oxynitride borides thereof in a composition ratio of less than 20%.

As described above, a compound material containing Ta as a main component has been applied to the absorption layer 4 of conventional EUV reflective photomasks. In this case, a film thickness of 40 nm or more has been required to obtain an optical density OD (Equation 1), which is an index indicating contrast between light intensities of the reflective portion 7 and the low reflective portion 8, equal to or more than 1, and a film thickness of 70 nm or more has been required to obtain an OD value of 2 or more.

$$OD=-\log(Ra/Rm) \qquad \text{(Equation 1)}$$

Note that, in Equation 1 above, "Rm" represents the intensity of reflected light from the reflective portion 7, and "Ra" represents the intensity of reflected light from the low reflective portion 8.

In addition, in conventional EUV reflective photomasks, a reflectance from the low reflective portion 8 including a compound material containing Ta as a main component as described above and having a film thickness of 60 nm is approximately 2%, which corresponds to approximately 1.5 when converted into an OD with the reflective portion 7. The larger the OD value, the higher the contrast, as a result of which high transferability can be obtained. Pattern transfer requires an OD value larger than 1. However, from a comparison with the above conventional case, the OD value is more preferably 1.5 or more.

Embodiment 2

Each configuration of the reflective photomask blank 10 and the reflective photomask 20 according to Embodiment 2 of the present invention is the same as each configuration of the reflective photomask blank 10 and the reflective photomask 20 according to Embodiment 1 of the present invention described above except to for each configuration of the absorption layer 4 and the outermost layer 5. Accordingly, the present embodiment describes the absorption layer 4 and the outermost layer 5, which are portions different from those of Embodiment 1 of the present invention, and description of the other portions is omitted.

<Absorption Layer>

Figure 5:
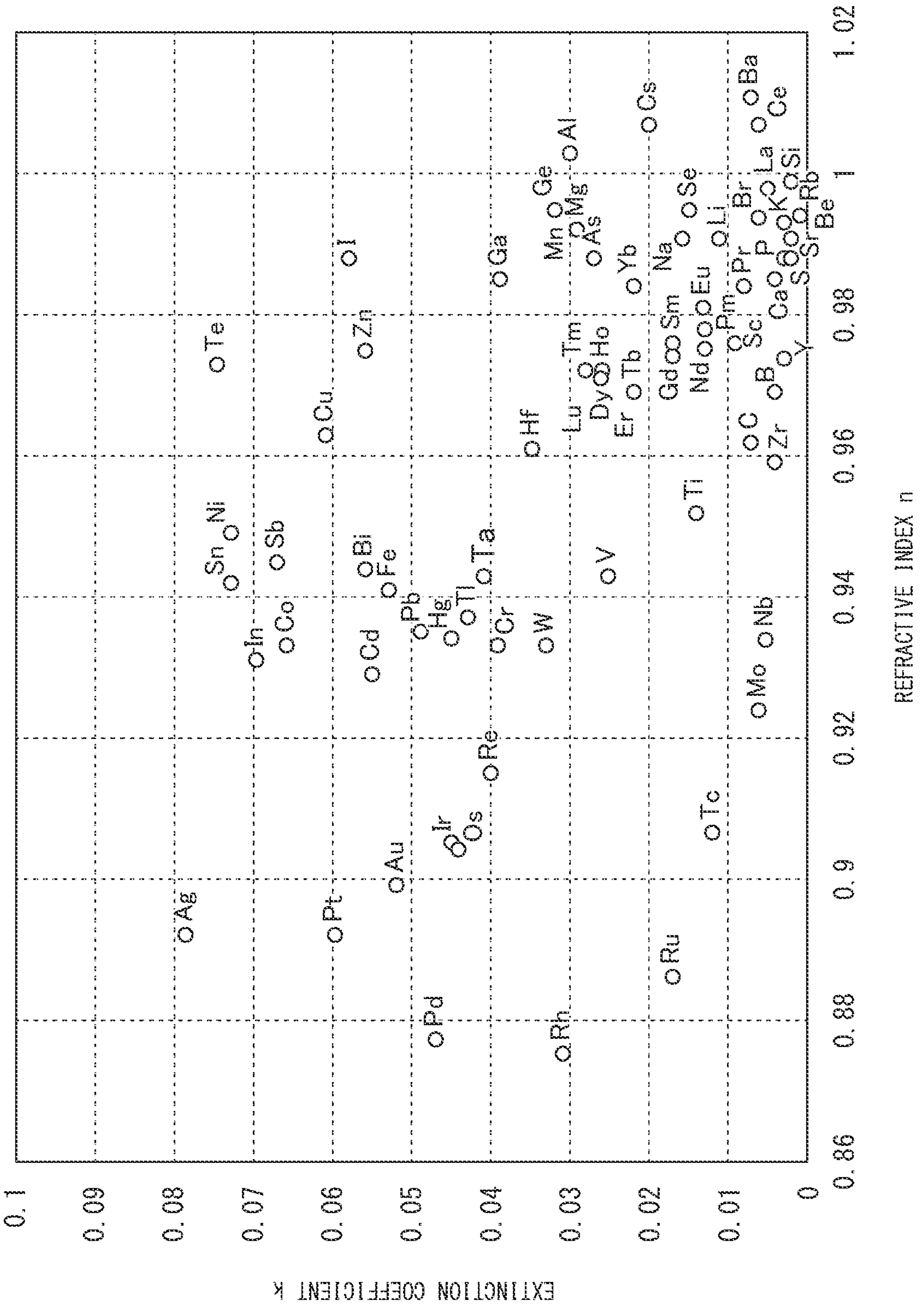
FIG. 5 is a map illustrating a refractive index n and an extinction coefficient k at a wavelength of EUV light.

FIG. 5 is a graph illustrating optical constants of some metal materials for EUV light with a wavelength of 13.5 nm. The horizontal axis of FIG. 5 represents a refractive index n, and the vertical axis thereof represents the extinction coefficient k. The extinction coefficient k of tantalum (Ta) which is the main material of the conventional absorption layer 4, is 0.041. Using a material having an extinction coefficient k higher than that can reduce the thickness of the absorption layer 4 as compared with the conventional one.

Examples of materials satisfying the extinction coefficient k as mentioned above include silver (Ag), platinum (Pt), indium (In), cobalt (Co), tin (Sn), nickel (Ni), and tellurium (Te), as illustrated in FIG. 5.

As described above, a compound material containing Ta as the main component has been applied to the absorption layer 4 of the conventional EUV reflective photomasks. In this case, as described in Embodiment 1, to obtain an OD value of 1 or more, the film thickness of the absorption layer 4 has been required to be 40 nm or more, and to obtain an OD value of 2 or more, the film thickness of the absorption layer 4 has been required to be 70 nm or more. Although the extinction coefficient k of Ta is 0.041, applying a compound material including indium (In) and oxygen (O) having an extinction coefficient k of 0.06 or more to the absorption layer 4 can reduce the film thickness of the absorption layer 4 to 17 nm when the OD value is at least 1 or more, to 47 nm or less when the OD value is 1.8 or more, and to 45 nm or less when the OD value is 2 or more. However, when the film thickness of the absorption layer 4 exceeds 47 nm, pattern transfer may not be improved due to the shadowing effect.

Therefore, the absorption layer 4 according to Embodiment 2 of the present invention preferably contains a material including indium (In) and oxygen (O) as a main component and having a film thickness of from 17 nm to 47 nm. In other words, when the film thickness of the absorption layer 4 is in a range of from 17 nm to 47 nm, the shadowing effect can be sufficiently reduced as compared with the conventional absorption layer 4 formed of a compound material containing Ta as a main component, so that transfer performance is improved. Additionally, when the film thickness of the absorption layer 4 is in a range of from 17 nm to 45 nm, the OD value can be increased as compared with the conventional absorption layer 4 formed of a compound material containing Ta as a main component, thus improving transfer performance.

Additionally, the above-mentioned "main component" refers to a component that contains 50 atomic % or more of the atomic number of the entire absorption layer.

Furthermore, in order to transfer a fine pattern, desired is high contrast between intensities of light reflected from the reflective portion 7 and the low reflective portion 8, as in Embodiment 1. Therefore, the OD value of the absorption layer 4 is more preferably 1.5 or more.

The material including indium (In) and oxygen (O) as a main component for forming the absorption layer 4 is preferably between 1:1 and 1:1.5. In other words, an atomic number ratio (O/In) of oxygen (O) to indium (In) in the absorption layer 4 is preferably from 1 to 1.5. Note that this range is based on the fact that an atomic number ratio of less than 1 results in progressive reduction of thermal resistance, whereas an atomic number ratio of 1.5 results in a maximum stoichiometric ratio.

In addition, although the absorption layer 4 illustrated in FIGS. 1 and 2 is a single layer, the absorption layer 4 according to the present embodiment is not limited thereto. The absorption layer 4 according to the present embodiment may be, for example, one or more absorption layers, i.e., a multi-layer absorption layer. In other words, the absorption layer 4 according to the present embodiment may be divided into a plurality of layers. Even in that case, an overall film thickness obtained by totalizing film thicknesses of each absorption layer 4 is preferably from 17 nm to 47 nm, and preferably from 17 nm to 45 nm.

Additionally, the material forming the absorption layer 4 preferably contains a total of 50 atomic % or more of indium (In) and oxygen (O). This is because although EUV light absorption may decrease when the absorption layer 4 contains a component other than indium (In) and oxygen (O), the EUV light absorption slightly decreases when the content of the component other than indium (In) and oxygen (O) is less than 50 atomic %, and the performance of the EUV mask as the absorption layer 4 is hardly deteriorated.

The absorption layer 4 is formed on the capping layer 3, and may be composed of a material containing, as the material other than indium (In) and oxygen (O), less than 50 atomic % of at least one selected from, for example, beryllium (Be), calcium (Ca), scandium (Sc), vanadium (V), manganese (Mn), iron (Fe), cobalt (Co), copper (Cu), ruthenium (Ru), silver (Ag), barium (Ba), iridium (Ir), gold (Au), silicon (Si), germanium (Ge), hafnium (Hf), tantalum (Ta), aluminum (Al), palladium (Pd), zirconium (Zr), niobium (Nb), chromium (Cr), platinum (Pt), yttrium (Y), nickel (Ni), lead (Pb), titanium (Ti), gallium (Ga), tellurium (Te), tungsten (W), molybdenum (Mo), tin (Sn), arsenic (As), strontium (Sr), technetium (Tc), rhodium (Rh), rhenium (Re), osmium (Os), radium (Ra), and oxides, nitrides, fluorides, borides, oxynitrides, oxyborides, and oxynitride borides thereof.

When the material forming the absorption layer 4 contains, for example, at least one of beryllium (Be), calcium (Ca), scandium (Sc), vanadium (V), manganese (Mn), iron (Fe), copper (Cu), germanium (Ge), arsenic (As), strontium (Sr), technetium (Tc), rhodium (Rh), barium (Ba), tungsten (W), rhenium (Re), osmium (Os), gold (Au), or the like, roughness, in-plane dimensional uniformity, and in-plane uniformity of a transferred image are improved, so that the material can be sufficiently amorphous.

Additionally, when the material forming the absorption layer 4 contains, for example, at least one of silver (Ag), nickel (Ni), tellurium (Te), tin (Sn), or the like, the material can have a higher extinction coefficient k than that of tantalum (Ta), which is the conventional main component.

In addition, when the material forming the absorption layer 4 contains, for example, at least one of tantalum (Ta), silicon (Si), zirconium (Zr), hafnium (Hf), niobium (Nb), yttrium (Y), lead (Pb), gallium (Ga), or the like, reaction with hydrogen radicals is unlikely to occur, so that the material can be more hydrogen radical resistant.

Furthermore, when the material forming the absorption layer 4 contains, for example, at least one of aluminum (Al), chromium (Cr), zirconium (Zr), or the like, the material can be less reactive to chemicals such as SPM and APM commonly used for mask cleaning and can be more cleaning resistant.

Furthermore, when the material forming the absorption layer 4 contains, for example, at least one of silicon nitride (SiN), tantalum oxide (TaO), or the like, the material can have high absorption of light with a wavelength of from 190 nm to 260 nm, improving contrast of inspection light.

Still furthermore, when the material forming the absorption layer 4 contains, for example, at least one of cobalt (Co), ruthenium (Ru), iridium (Ir), gold (Au), palladium (Pd), platinum (Pt), molybdenum (Mo), or the like, the refractive index n at the wavelength of 13.5 nm is less than 0.95, so that the material can improve phase shift properties.

Although one example of effects of the materials that can be contained in the absorption layer 4 has been described above, the effects of each material are not limited to the above example and may be applicable to more than the one example.

Additionally, as described in Embodiment 1, the reflective photomask 20, which is exposed to hydrogen radical environments, cannot withstand long-term use without using a light absorbing material highly resistant to hydrogen radicals. In the present embodiment, materials having a film reduction rate of 0.1 nm/s or less in a hydrogen radical-rich environment in which hydrogen plasma is generated using microwave plasma with a power of 1 kw in a vacuum of 0.36 millibar (mbar) or less are considered as those having high hydrogen radical resistance.

Note that evaluation of hydrogen radical resistance in the present embodiment is not limited to the above evaluation method. For example, as illustrated in FIG. 4, compound materials having a film reduction rate of 0.1 nm/s or less in a hydrogen radical environment excited under conditions of a hydrogen flow rate of $10^{19}$ at/(cm$^2$s), a 40 MHz capacitively coupled plasma (CCP), and an inter-electrode distance of 18 mm may be considered as those having high hydrogen radical resistance.

Here, regarding measured values of the film reduction rate, the difference between the above-described two methods is very small, and almost the same value can be obtained.

Among materials that satisfy a combination of nk values, indium (In) by itself is known to be less resistant to hydrogen radicals.

In addition, in an evaluation test of film reduction rate illustrated in Table 1, the film reduction rate was repeatedly measured a plurality of times, in which when all the measurements had a film reduction rate of 0.1 nm/s or less, it was evaluated as "○", when although there was a film reduction of a few nm immediately after the start of hydrogen radical treatment, the film reduction rate thereafter was 0.1 nm/s or less, it was evaluated as "Δ", and when the film reduction rate exceeded 0.1 nm/s in all the measurements, it was evaluated as "x".

Furthermore, the above atomic number ratio (O/In ratio) is a result of measurement of a material formed into a film thickness of 1 μm through energy dispersive X-ray analysis (EDX).

Table 1 shows results of the above evaluation.

TABLE 1

| O/In ratio | 1.0 | 1.5 |
|---|---|---|
| Hydrogen radical resistance | x | Δ |

The film reduction rate was large when the O/In ratio was 1.0, and a slight film reduction occurred when the O/In ratio was 1.5.

<Outermost Layer>

As in Embodiment 1 even in the present embodiment, it is effective to use a highly resistant material for the outermost layer in order to improve hydrogen radical resistance. Desirably, the outermost layer 5 is formed of a material containing at least 80 atomic % or more of a material resistant to hydrogen radicals in order not to reduce hydrogen radical resistance. Therefore, the outermost layer 5 is desirably formed of a material containing at least 80 atomic % or more of a material including any one or more of, for example, tantalum (Ta), aluminum (Al), silicon (Si), palladium (Pd), zirconium (Zr), hafnium (Hf), niobium (Nb), chromium (Cr), platinum (Pt), yttrium (Y), nickel (Ni), lead (Pb), titanium (Ti), gallium (Ga), bismuth (Bi), and oxides, nitrides, fluorides, borides, oxynitrides, oxyborides, and oxynitride borides thereof. In addition, the material forming the outermost layer 5 may include materials other than those mentioned above.

As in Embodiment 1, the low reflective portion 8 has a combined film thickness of the absorption layer 4 and the outermost layer 5, so that there is a concern of an increased shadowing effect. Therefore, the total of layer thicknesses of each of the absorption layer 4 and the outermost layer 5 is desirably 60 nm or less, as in Embodiment 1. Additionally, when the outermost layer 5 is formed of a material having sufficient hydrogen radical resistance, the film thickness of the outermost layer 5 is preferably 1 nm or more in order to obtain a stable film thickness distribution, as in Embodiment 1.

An evaluation test of film reduction rate at each layer thickness of the outermost layer 5 was performed using indium oxide (O/In=1.5) as the absorption layer 4 and tantalum oxide (TaO) as the outermost layer 5. Note that an evaluation criteria of the present evaluation is the same as those in the evaluation test of film reduction rate given in Table 1.

Table 2 shows results of the above evaluation.

TABLE 2

| TaO film thickness (nm) | 1 | 5 | 10 |
|---|---|---|---|
| Hydrogen radical resistance | ○ | ○ | ○ |

As depicted in Table 2, when the film thickness of tantalum oxide (TaO) was 1 nm, 5 nm, and 10 nm, no film reduction occurred.

The outermost layer 5 is formed on the absorption layer 4. As in Embodiment 1, a film quality thereof is preferably sufficiently amorphous for roughness and in-plane dimensional uniformity of an absorption pattern **7*a* after etching, or in-plane uniformity of a transferred image. Therefore, the material forming the outermost layer 5** may be a material containing at least one element selected from, for example, beryllium (Be), calcium (Ca), scandium (Sc), vanadium (V), manganese (Mn), iron (Fe), cobalt (Co), copper (Cu), germanium (Ge), arsenic (As), strontium (Sr), molybdenum (Mo), technetium (Tc), ruthenium (Ru), rhodium (Rh), silver (Ag), barium (Ba), tungsten (W), rhenium (Re), osmium (Os), iridium (Ir), gold (Au), radium (Ra), and oxides, nitrides, fluorides, borides, oxynitrides, oxyborides, and oxynitride borides thereof in a composition ratio of less than 20%.

Additionally, the material forming the outermost layer 5 may be a compound material containing, in addition to the above material, at least one element selected from, for example, boron (B), nitride (N), germanium (Ge), hafnium (Hf) and oxides, nitrides, and oxynitrides thereof in a composition ratio of less than 20%.

Although the configurations of Embodiments 1 and 2 of the present invention have been described above, the present invention is not limited to the configurations of each Embodiment. For example, in the present invention, the configuration of Embodiment 1 and the configuration of Embodiment 2 may be combined together for use. Even when the configurations of Embodiments 1 and 2 described above are used in combination, the object of the present application can be achieved.

EXAMPLES

Hereinafter, Examples of the reflective photomask blank and the photomask according to Embodiment 1 of the present invention are described with reference to the drawings and tables.

Example 1-1

First, a method for producing a reflective photomask blank 100 is described with reference to FIG. 6.

Figure 6:
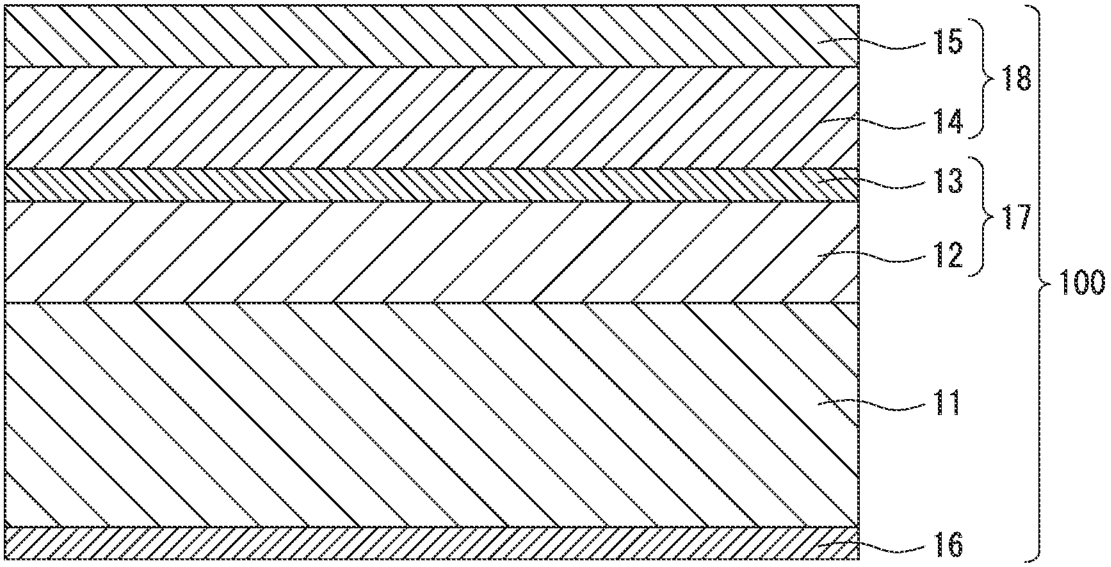
FIG. 6 is a schematic cross-sectional diagram illustrating the structure of a reflective photomask blank according to the Example of the present invention.

First, as illustrated in FIG. 6, a multi-layer reflective film 12 formed by depositing 40 deposited films each including a pair of silicon (Si) and molybdenum (Mo) was formed on a synthetic quartz substrate 11 having low thermal expansion characteristics. The multi-layer reflective film 12 had a film thickness of 280 nm. In FIG. 6, the multi-layer reflective film 12 including several pairs of deposited films is simply illustrated as "the multi-layer reflective film 12", for convenience.

Next, a capping layer 13 formed of ruthenium (Ru) as an intermediate film was film-formed on the multi-layer reflective film 12 so as to have a film thickness of 2.5 nm. This resulted in formation of a reflective portion 17 including the multi-layer reflective film 12 and the capping layer 13 on the substrate 11.

Then, an absorption layer 14 formed of tin oxide (SnO) was film-formed on the capping layer 13 so as to have a film thickness of 25 nm. The atomic number ratio of tin (Sn) to oxygen (O) was 1:1.6 as measured by an X-ray photoelectron spectroscopy (XPS). Note that preferably, tin (Sn) is bonded with O/Sn>1 for chemical stabilization. Additionally, crystallinity of the absorption layer 14 was measured by an X-ray diffractometer (XRD) and found to be amorphous, although crystallinity was slightly observed.

Next, the outermost layer 15 formed of tantalum oxide (TaO) was film-formed on the absorption layer 14 so as to have a film thickness of 2 nm. This resulted in formation of a low reflective portion 18 including the absorption layer 14 and the outermost layer 15 on the reflective portion 17.

Then, a backside conductive film 16 formed of chromium nitride (CrN) was film-formed with a thickness of 100 nm on a side of the substrate 11 not having the multi-layer reflective film 12 to produce the reflective photomask blank 100 of Example 1-1.

The film formation of each film (layer formation) on the substrate 11 was performed using a multi-source sputtering apparatus. The film thickness of each film was controlled by sputtering time.

Next, a method for producing a reflective photomask 200 is described with reference to FIGS. 7 to 11.

Figure 7:
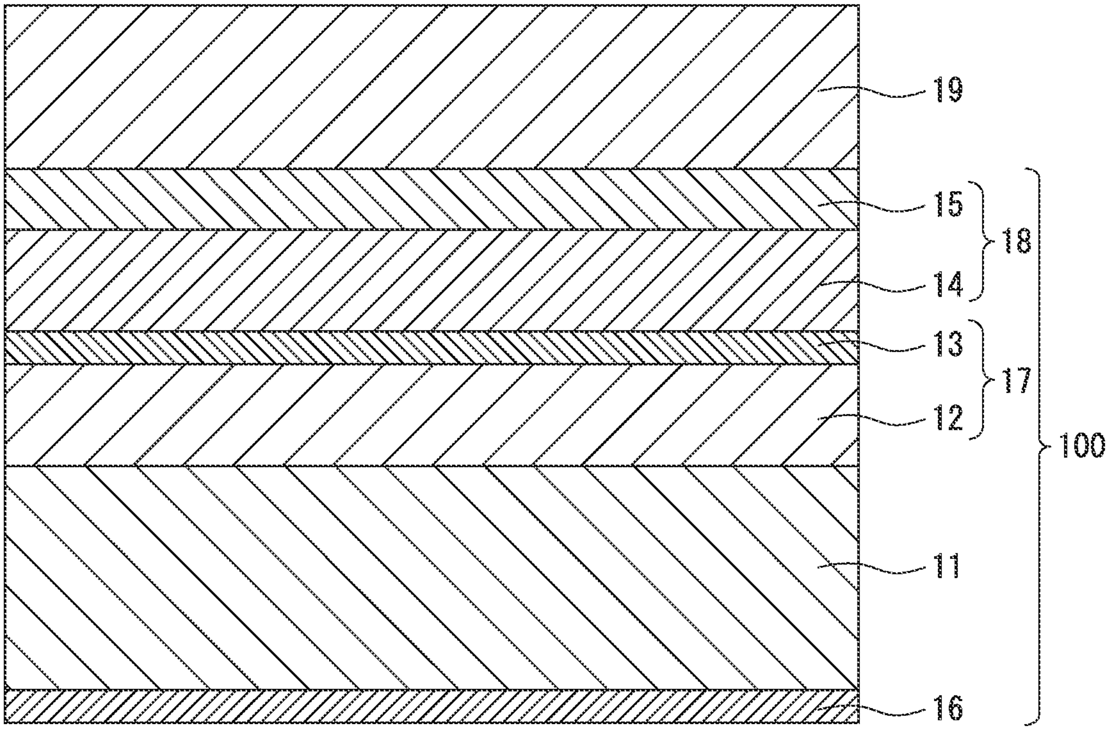
FIG. 7 is a schematic cross-sectional diagram illustrating a step of manufacturing a reflective photomask according to the Example of the present invention.

First, as illustrated in FIG. 7, a chemically amplified positive resist (SEBP 9012: manufactured by Shin-Etsu Chemical Co., Ltd.) was film-formed on the low reflective portion 18 of the reflective photomask blank 100 by spin coating to a film thickness of 120 nm, and baking was performed at 110° C. for 10 minutes to form a resist film 19.

Figure 8:
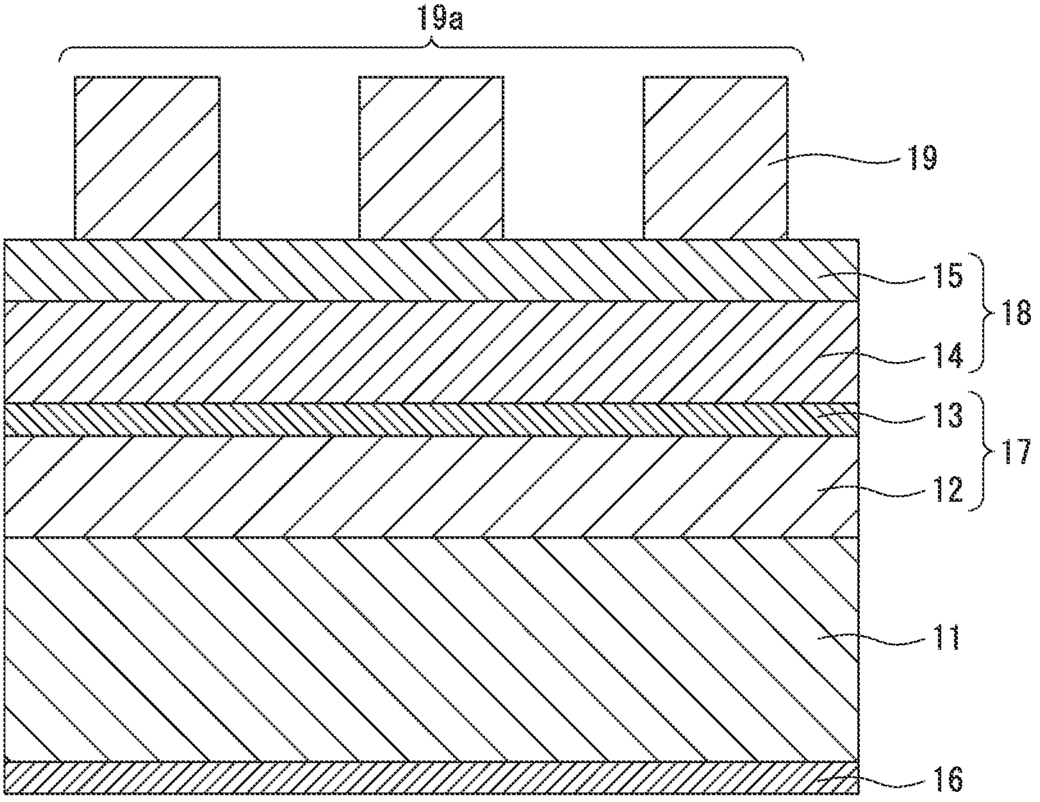
FIG. 8 is a schematic cross-sectional diagram illustrating a step of manufacturing the reflective photomask according to the Example of the present invention.

Then, a predetermined pattern was drawn on the resist film 19 formed of the chemically amplified positive resist by an electron beam lithography system (JBX 3030: manufactured by JEOL Ltd). After that, baking treatment was performed at 110° C. for 10 minutes, followed by spray development (SFG 3000: manufactured by Sigma Meltec Ltd). This resulted in formation of a resist pattern 19*a*, as illustrated in FIG. 8.

Figure 9:
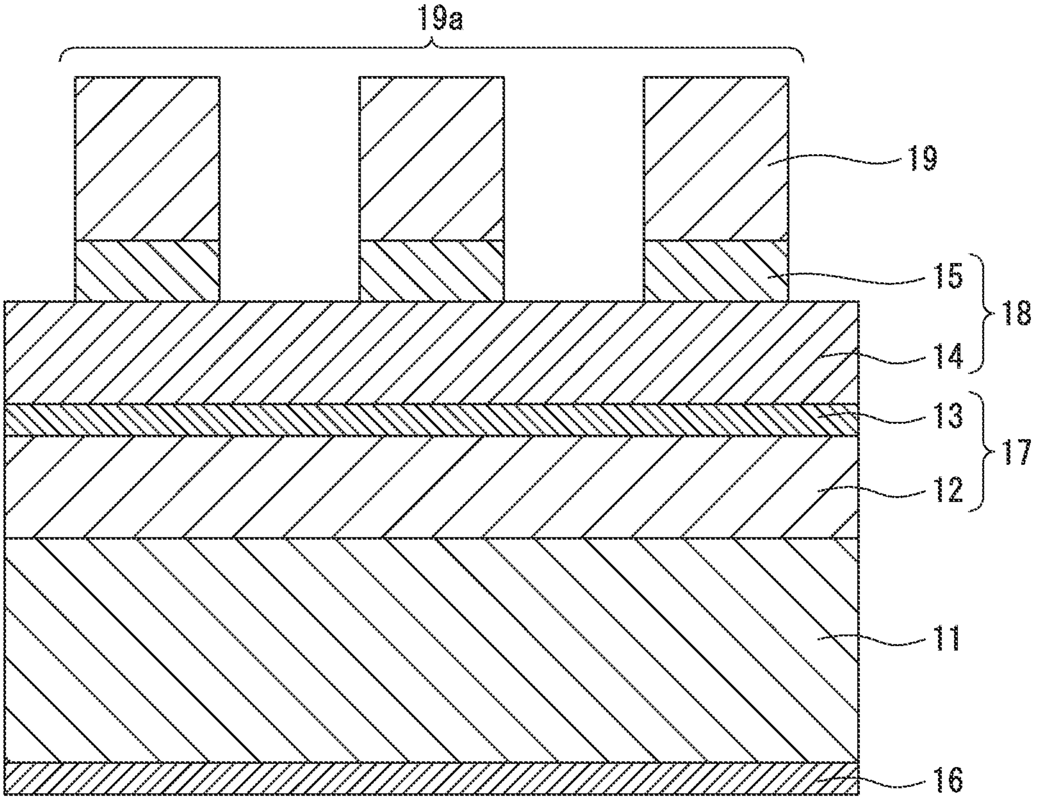
FIG. 9 is a schematic cross-sectional diagram illustrating a step of manufacturing the reflective photomask according to the Example of the present invention.

Next, using the resist pattern 19*a* as an etching mask, the outermost layer 15 was patterned by dry etching mainly using a fluorine-based gas to form an outermost layer pattern in the outermost layer 15, as illustrated in FIG. 9.

Figure 10:
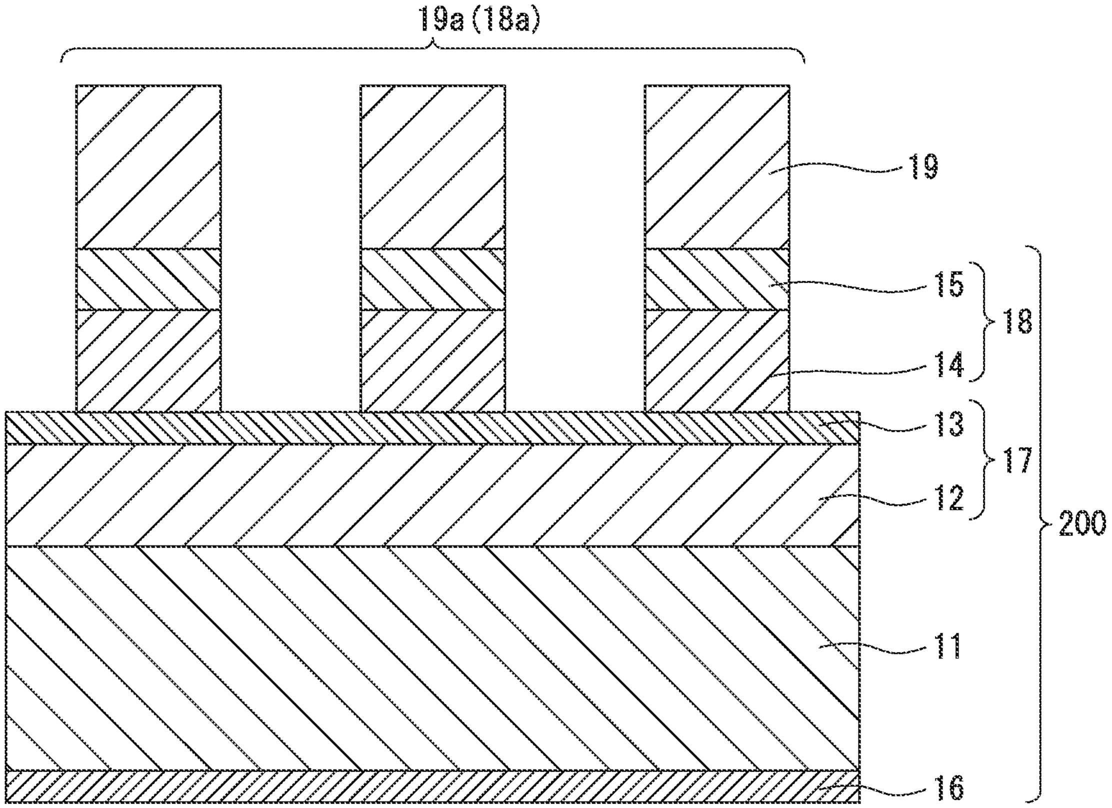
FIG. 10 is a schematic cross-sectional diagram illustrating a step of manufacturing the reflective photomask according to the Example of the present invention.

Then, the absorption layer 14 was patterned by dry etching mainly using a chlorine-based gas to form an absorption layer pattern. As a result, a low reflective portion pattern 18*a* was formed, as illustrated in FIG. 10.

Figure 11:
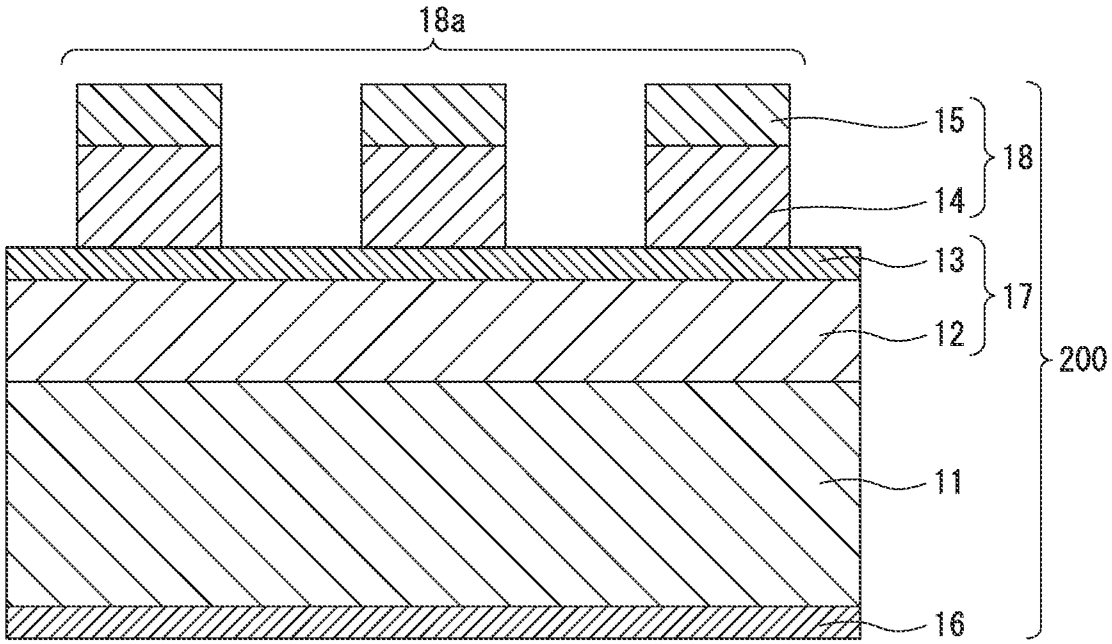
FIG. 11 is a schematic cross-sectional diagram illustrating the structure of the reflective photomask according to the Example of the present invention.

Subsequently, the remaining resist pattern 19*a* was peeled off to produce the reflective photomask 200 of the present Example, as illustrated in FIG. 11.

Next, the reflective photomask 200 was immersed in sulfuric acid at 80° C. for 10 minutes, and then cleaned by being immersed in a cleaning bath containing a mixture of ammonia, hydrogen peroxide solution, and water at a ratio of 1:1:20 for 10 minutes and being washed with running water for 10 minutes using a 500 W megasonic cleaner. In the present Example, the film thickness was measured by an AFM and compared with the film thickness at the time of film formation, but no change was observed. Note that as a cleaning resistance required for the photomask in the present Example, the material and structure resulting in a film reduction amount of 1 nm or less through the above cleaning step are considered as having high cleaning resistance.

Figure 12:
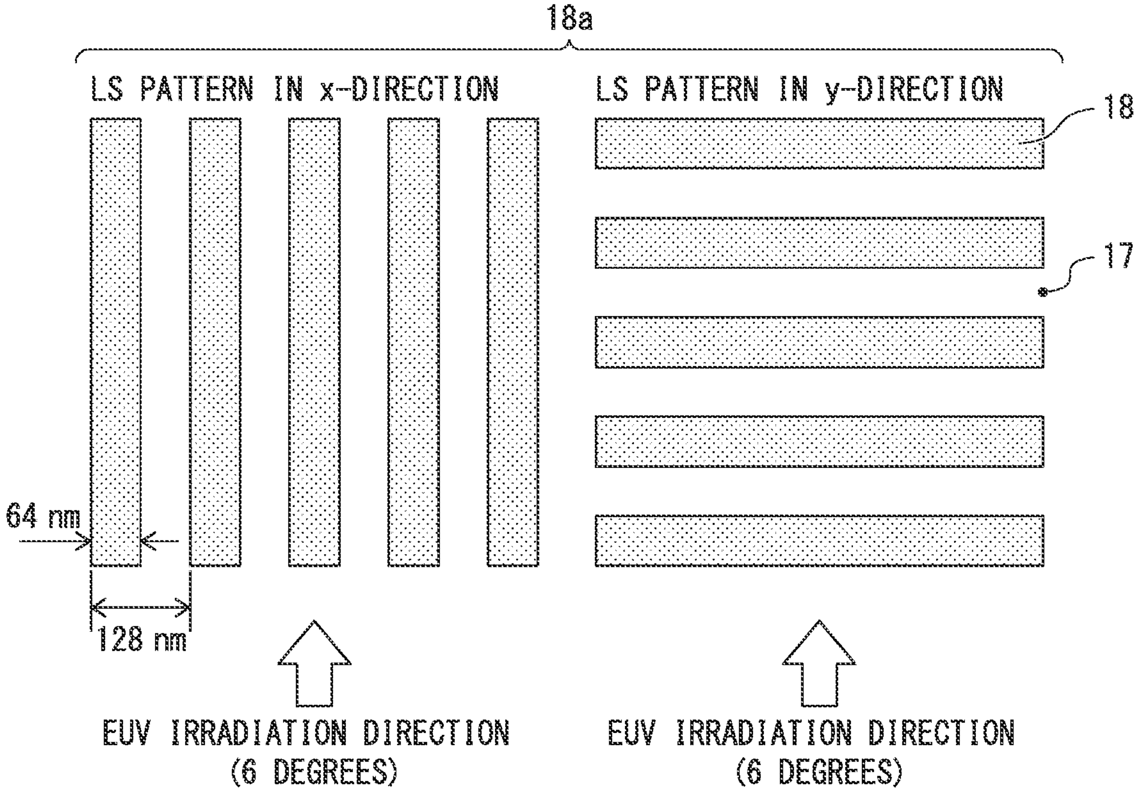
FIG. 12 is a schematic plan view illustrating a design pattern of the reflective photomask according to the Example of the present invention.

In the present Example, the low reflective portion pattern 18*a* formed in the low reflective portion 18 includes a line width 64 nm LS (line and space) pattern, a line width 200 nm LS pattern for measuring the film thickness of the absorption layer using an AFM, and a 4 mm square low reflective portion removing portion for measuring EUV reflectance on the reflective photomask 200 for transfer evaluation. In the present Example, the line width 64 nm LS pattern was designed in each of an x-direction and a y-direction, as illustrated in FIG. 12, so that influence of the shadowing effect caused by EUV irradiation was easily visible.

Example 1-2

The absorption layer 14 was formed of a compound material in which tin oxide (SnO) and silicon oxide (SiO) were homogenous at a ratio of 50:50, and was film-formed so as to have a film thickness of 47 nm. Silicon oxide (SiO) was selected because it is highly transparent to EUV light, i.e., it is a compound material having the lowest EUV absorption in the above-mentioned first material group.

Next, the outermost layer 15 formed of tantalum oxide (TaO) was film-formed on the absorption layer 14 so as to have a film thickness of 1.5 nm. As a result, the film thickness of the low reflective portion 18 was 48.5 nm in total. In addition, the reflective photomask blank 100 and the reflective photomask 200 of Example 1-2 were produced in the same manner as in Example 1-1 except for each film formation of the absorption layer 14 and the outermost layer 15.

Example 1-3

The absorption layer 14 was formed of a compound material in which tin oxide (SnO) and silicon oxide (SiO) were homogenous at a ratio of 50:50, and was film-formed so as to have a film thickness of 47 nm.

Next, the outermost layer 15 formed of molybdenum (Mo) was film-formed on the absorption layer 14 so as to have a film thickness of 13 nm. The film thickness of the low reflective portion 18 resulted in a total of 60 nm. In addition, the reflective photomask blank 100 and the reflective photomask 200 of Example 1-3 were produced in the same manner as in Example 1-1 except for each film formation of the absorption layer 14 and the outermost layer 15.

Example 1-4

The absorption layer 14 formed of tin oxide (SnO) was film-formed so as to have a film thickness of 17 nm.

Next, the outermost layer 15 formed of tantalum oxide (TaO) was film-formed on the absorption layer 14 so as to have a film thickness of 1.5 nm. The film thickness of the low reflective portion 18 resulted in a total of 18.5 nm. In addition, the reflective photomask blank 100 and the reflective photomask 200 of Example 1-4 were produced in the same manner as in Example 1-1 except for each film formation of the absorption layer 14 and the outermost layer 15.

Example 1-5

The absorption layer 14 was formed of a compound material in which tin oxide (SnO) and silicon oxide (SiO) were homogenous at a ratio of 50:50, and was film-formed so as to have a film thickness of 35 nm.

Next, the outermost layer 15 formed of tantalum oxide (TaO) was formed on the absorption layer 14 so as to have a film thickness of 1.5 nm. The film thickness of the low reflective portion 18 resulted in a total of 36.5 nm. In addition, the reflective photomask blank 100 and the reflective photomask 200 of Example 1-5 were produced in the same manner as in Example 1-1 except for each film formation of the absorption layer 14 and the outermost layer 15.

Example 1-6

The absorption layer 14 formed of tin oxide (SnO) was film-formed so as to have a film thickness of 16 nm.

Next, the outermost layer 15 formed of tantalum oxide (TaO) was film-formed on the absorption layer 14 so as to have a film thickness of 0.8 nm. The film thickness of the low reflective portion 18 resulted in a total of 16.8 nm. In addition, the reflective photomask blank 100 and the reflective photomask 200 of Example 1-6 were produced in the same manner as in Example 1-1 except for each film formation of the absorption layer 14 and the outermost layer 15.

Example 1-7

The absorption layer 14 formed of tin oxide (SnO) was film-formed so as to have a film thickness of 17 nm.

Next, the outermost layer 15 formed of tantalum oxide (TaO) was film-formed on the absorption layer 14 so as to have a film thickness of 0.8 nm. The film thickness of the low reflective portion 18 resulted in a total of 17.8 nm. In addition, the reflective photomask blank 100 and the reflective photomask 200 of Example 1-7 were produced in the same manner as in Example 1-1 except for each film formation of the absorption layer 14 and the outermost layer 15.

Comparative Example 1-1

The absorption layer 14 formed of tantalum nitride (TaN) was film-formed so as to have a film thickness of 58 nm. Additionally, the outermost layer 15 was formed of tantalum oxide (TaO) and film-formed so as to have a film thickness of 2 nm. The present Comparative Example assumes a conventional reflective photomask provided with an existing film containing tantalum (Ta) as a main component. In addition, the reflective photomask blank 100 and the reflective photomask 200 of Comparative Example 1-1 were produced in the same manner as in Example 1-1 except for each film formation of the absorption layer 14 and the outermost layer 15.

Comparative Example 1-2

The absorption layer 14 was formed of a compound material in which tin oxide (SnO) and silicon oxide (SiO) were homogenous at a ratio of 40:60, and was film-formed so as to have a film thickness of 42 nm.

Next, the outermost layer 15 formed of tantalum oxide (TaO) was film-formed on the absorption layer 14 so as to have a film thickness of 1.5 nm. The film thickness of the low reflective portion 18 resulted in a total of 43.5 nm. In addition, the reflective photomask blank 100 and the reflective photomask 200 of Comparative Example 1-2 were produced in the same manner as in Example 1-1 except for each film formation of the absorption layer 14 and the outermost layer 15.

Comparative Example 1-3

The absorption layer 14 formed of tin oxide (SnO) was film-formed so as to have a film thickness of 25 nm. However, the outermost layer 15 was not formed. In addition, other than that, the reflective photomask blank 100 and the reflective photomask 200 of Comparative Example 1-3 were produced in the same manner as in Example 1-1.

The reflectance Rm in the reflective layer region and the reflectance Ra in the low reflective portion region of each of the reflective photomasks 200 produced in the above-described Examples and Comparative Examples were measured by a reflectance measuring device using EUV light. The reflectance Rm was measured at a 4 mm square absorption layer removing portion. From results of the measurement, the OD value was calculated using Equation (1) described above.

(Hydrogen Radical Resistance)

As illustrated in FIG. 4, hydrogen at a flow rate of $10^{19}$ at/(cm$^2$s) was excited in a chamber 300 to generate hydrogen plasma using a 40 MHz capacitively coupled plasma (CCP). As a sample 302, each reflective photomask 200 produced in Examples and Comparative Examples was placed on one of electrodes 301 located at an inter-electrode distance of 18 mm, and the hydrogen radical resistance of each sample 302 was measured. The hydrogen radical resistance was measured by confirming a change in the film thickness of the low reflective portion 18 through an atomic force microscope (AFM) after the hydrogen radical treatment. Additionally, a line width 200 nm LS pattern was used for the measurement of the hydrogen radical resistance.

(Wafer Exposure Evaluation)

Using an EUV exposure system (NXE 3300b: manufactured by ASML Co., Ltd.), the low reflective portion pattern 18*a* of each reflective photomask 200 produced in Examples and Comparative Examples was transferred and exposed on a semiconductor wafer coated with a chemically amplified EUV positive resist. At this time, the amount of exposure was adjusted so that the LS pattern in the x-direction illustrated in FIG. 12 was transferred as designed. Specifically, in the present exposure test, the LS pattern (line width 64 nm) in the x-direction illustrated in FIG. 12 was exposed on the semiconductor wafer so as to have a line width of 16 nm. Observation and line width measurement of the transferred resist pattern were performed by an electron beam dimension measuring apparatus to confirm resolution.

Table 3 shows results of these evaluations.

| | Absorption layer | | Outermost layer | | Low reflective portion | Mask characteristics | | | |
|---|---|---|---|---|---|---|---|---|---|
| | Material | Film thickness | Material | Film thickness | Total film thickness | OD value | Pattern transferability | Hydrogen radical resistance | Cleaning resistance |
| Ex. 1-1 | Tin oxide | 25 nm | Tantalum oxide | 2 nm | 27 nm | ○ (2.0) | ○ (H-V bias 4 nm) | ○ | ○ |
| Ex. 1-2 | Tin oxide, Silicon oxide (mixing ratio 1:1) | 47 nm | Tantalum oxide | 1.5 nm | 48.5 nm | ○ (1.7) | ○ (H-V bias 5 nm) | ○ | ○ |
| Ex. 1-3 | Tin oxide, Silicon oxide (mixing ratio 1:1) | 47 nm | Molybdenum | 13 nm | 60 nm | ○ (1.6) | ○ (H-V bias 6 nm) | ○ | ○ |
| Ex. 1-4 | Tin oxide | 17 nm | Tantalum oxide | 1.5 nm | 18.5 nm | Δ (1.0) | ○ (H-V bias 6 nm) | ○ | ○ |
| Ex. 1-5 | Tin oxide, Silicon oxide (mixing ratio 1:1) | 35 nm | Tantalum oxide | 1.5 nm | 36.5 nm | Δ (1.0) | ○ (H-V bias 6 nm) | ○ | ○ |
| Ex. 1-6 | Tin oxide | 16 nm | Tantalum oxide | 0.8 nm | 16.8 nm | Δ (0.99) | ○ (H-V bias 6 nm) | Δ | ○ |
| Ex. 1-7 | Tin oxide | 17 nm | Tantalum oxide | 0.8 nm | 17.8 nm | Δ (1.0) | ○ (H-V bias 6 nm) | Δ | ○ |
| Comp. Ex. 1-1 (existing film) | Tantalum nitride | 58 nm | Tantalum oxide | 2 nm | 60 nm | ○ (1.5) | Δ (H-V bias 7 nm) | ○ | ○ |
| Comp. Ex. 1-2 | Tin oxide, Silicon oxide (mixing ratio 2:3) | 42 nm | Tantalum oxide | 1.5 nm | 43.5 nm | Δ (1.0) | × (Not resolved) | — | ○ |
| Comp. Ex. 1-3 | Tin oxide | 25 nm | — | — | 25 nm | ○ (1.7) | ○ (H-V bias 4 nm) | × | ○ |

Comparative Example 1-1 in Table 3 shows mask characteristics and a resist pattern dimension on the wafer in the reflective photomask 200 including the tantalum (Ta)-based existing film in which the absorption layer 14 is formed of tantalum nitride (TaN) and the film thickness thereof is 58 nm and the outermost layer 15 is formed of tantalum oxide (TaO) and the film thickness thereof is 2 nm. Note that the resist pattern dimension on the wafer is a numerical value given as "H-V bias" in the column of "Pattern transferability".

In the reflective photomask 200 of Comparative Example 1-1, the OD value was 1.5, which provided a contrast allowing for pattern transfer. Additionally, as a result of the patterning with EUV light, the pattern dimension in the y-direction was 9 nm and the H-V bias (horizontal-vertical dimensional difference) was 7 nm, where although the pattern was resolved, influence of the shadowing effect was significant, resulting in low transferability. In addition, in the present Example, the conditions of material and structure resulting in a bias value smaller than the H-V bias of the tantalum (Ta)-based existing film are considered as conditions under which transferability was improved.

Example 1-1 in Table 3 shows mask characteristics and a resist pattern dimension on the wafer in the reflective photomask 200 provided with the low reflective portion 18 including the absorption layer 14 formed of tin oxide (SnO) and the film thickness of 25 nm and the outermost layer 15 formed of tantalum oxide (TaO) and the film thickness of 2 nm.

In the reflective photomask 200 of Example 1-1, no change in film thickness in response to hydrogen radicals was observed, which was a favorable result. An OD value of 2.0 indicated a sufficiently high contrast. The patterning with EUV light resulted in an H-V bias of 4 nm, which was the best result in the present evaluation.

Example 1-2 in Table 3 shows mask characteristics and a resist pattern dimension on the wafer in the reflective photomask 200 provided with the low reflective portion 18 including the absorption layer 14 formed of a compound material containing tin oxide (SnO) and silicon oxide (SiO) (mixing ratio 1:1) and having the film thickness of 47 nm and the outermost layer 15 formed of tantalum oxide (TaO) and having the film thickness of 1.5 nm.

In the reflective photomask 200 of Example 1-2, there was no change in film thickness in response to hydrogen radicals, which was a favorable result. An OD value of 1.7 indicated a sufficient contrast. Silicon oxide (SiO) is a material having low absorption of EUV light, and the mixing ratio was 1:1, i.e., the content of the material of the first material group was 50 atomic %, but a sufficient contrast was obtained with the film thickness of 47 nm. As a result of the patterning with EUV light, the H-V bias was 5 nm, so that the shadowing effect was reduced as compared with Comparative Example 1-1, resulting in improved pattern transferability.

Example 1-3 in Table 3 shows mask characteristics and a resist pattern dimension on the wafer in the reflective photomask 200 provided with the low reflective portion 18 including the absorption layer 14 formed of a compound material containing tin oxide (SnO) and silicon oxide (SiO) (mixing ratio 1:1) and having the film thickness of 47 nm and the outermost layer 15 formed of molybdenum (Mo) and having the film thickness of 13 nm.

In the reflective photomask 200 of Example 1-3, there was no change in film thickness in response to hydrogen radicals. An OD value of 1.6 indicated a sufficient contrast. As a result of the patterning with EUV light, the H-V bias was 6 nm, and the pattern was able to be transferred. The film thickness of the low reflective portion 18, which was a total of the thicknesses of each of the absorption layer 14 and the outermost layer 15, was 60 nm. However, the combination of the compound material of the absorption layer 14 and the material of the outermost layer 15 reduced the shadowing effect, which allowed for improved pattern transferability.

Example 1-4 in Table 3 shows mask characteristics and a resist pattern dimension on the wafer in the reflective photomask 200 provided with the low reflective portion 18 including the absorption layer 14 formed of tin oxide (SnO) and having the film thickness of 17 nm and the outermost layer 15 formed of tantalum oxide (TaO) and having the film thickness of 1.5 nm.

In the reflective photomask 200 of Example 1-4, there was no change in film thickness in response to hydrogen radicals. The OD value was 1.0. As a result of the patterning with EUV light, the H-V bias was 6 nm, and the pattern was able to be transferred.

Example 1-5 in Table 3 shows mask characteristics and a resist pattern dimension on the wafer in the reflective photomask 200 provided with the low reflective portion 18 including the absorption layer 14 formed of a compound material containing tin oxide (SnO) and silicon oxide (SiO) (mixing ratio 1:1) and having the film thickness of 35 nm and the outermost layer 15 formed of tantalum oxide (TaO) and having the film thickness of 1.5 nm.

In the reflective photomask 200 of Example 1-5, no change in film thickness in response to hydrogen radicals was observed. The OD value was 1.0. As a result of the patterning with EUV light, the H-V bias was 6 nm, and the pattern was able to be transferred. This result indicates that in the case of the absorption layer 14 in which the content of the material from the first material group is 50 atomic %, the film thickness thereof can be reduced to 35 nm.

Example 1-6 in Table 3 shows mask characteristics and a resist pattern dimension on the wafer in the reflective photomask 200 provided with the low reflective portion 18 including the absorption layer 14 formed of tin oxide (SnO) and having the film thickness of 16 nm and the outermost layer 15 formed of tantalum oxide (TaO) and having the film thickness of 0.8 nm.

In the reflective photomask 200 of Example 1-6, a slight change in film thickness in response to hydrogen radicals was observed. This is considered to be because the film thickness of the outermost layer 15 was thin, and the film formation was not uniform, so that the absorption layer was selectively reduced due to the uneven film formation. The OD value was 0.99, which was not sufficient for the contrast to allow transfer. As a result of the patterning with EUV light, the H-V bias was 6 nm, and the pattern was able to be transferred. However, line edge roughness increased due to the insufficient contrast.

Example 1-7 in Table 3 shows mask characteristics and a resist pattern dimension on the wafer in the reflective photomask 200 provided with the low reflective portion 18 including the absorption layer 14 formed of tin oxide (SnO) and having the film thickness of 17 nm and the outermost layer 15 formed of tantalum oxide (TaO) and having the film thickness of 0.8 nm.

In the reflective photomask 200 of Example 1-7, a slight change in film thickness in response to hydrogen radicals was observed, as in Example 1-6. The OD value was 1.0. As a result of the patterning with EUV light, the H-V bias was 6 nm, and the pattern was able to be transferred. Since the contrast was higher than that of Example 1-6, no deterioration of line edge roughness was observed.

Comparative Example 1-2 in Table 3 shows mask characteristics and a resist pattern dimension on the wafer in the reflective photomask 200 provided with the low reflective portion 18 including the absorption layer 14 formed of a compound material containing tin oxide (SnO) and silicon oxide (SiO) (mixing ratio 2:3) and having the film thickness of 42 nm and the outermost layer 15 formed of tantalum oxide (TaO) and having the film thickness of 1.5 nm.

In the reflective photomask 200 of Comparative Example 1-2, the OD value was 1.0. As a result of the patterning with EUV light, the pattern was not transferred in the y-direction. When the content ratio of the first material group is less than 50 atomic %, sufficient contrast cannot be obtained without increasing the film thickness of the absorption layer 14. Increasing the film thickness thereof in order to obtain contrast increased the shadowing effect, resulting in deteriorated transferability. Additionally, the evaluation of hydrogen radical resistance was not performed.

Comparative Example 1-3 in Table 3 shows mask characteristics and a resist pattern dimension on the wafer in the reflective photomask 200 in which the absorption layer 14 was formed of tin oxide (SnO) and had the film thickness of 25 nm, and the outermost layer 15 was not formed.

In the reflective photomask 200 of Comparative Example 1-2, the OD value was 1.7, so that sufficient contrast was obtained. As a result of the pattering with EUV light, the H-V bias was 4 nm, which indicated high transferability. However, the evaluation of hydrogen radical resistance resulted in a change in film thickness between before and after the treatment.

In addition, in Table 3, each evaluation result is marked with "○" when the reflective photomask is evaluated as having excellent characteristics, "Δ" when evaluated as having characteristics that are not problematic for use, and "x" when evaluated as having problematic characteristics for use.

When comparing Examples 1-1 to 1-5 with the existing film (Comparative Example 1-1), it is clear that the hydrogen radical resistance is comparable and pattern transferability is improved. Additionally, when comparing Examples 1-1 to 1-7 with Comparative Example 1-3, the low reflective portion 18 including the outermost layer 15 formed of the material containing at least one from the second material group is clearly more resistant to hydrogen radicals than the low reflective portion 18 formed only by the absorption layer 14.

Furthermore, in any of the reflective photomasks 200 of Examples 1-1 to 1-7 and Comparative Examples 1-1 to 1-3, there was no change in film thickness between before and after the cleaning treatment, resulting in high cleaning resistance.

Thus, clearly, the reflective photomask 200 in which the outermost layer 15 including 80 atomic % or more of a compound material prepared from among the second material group is formed on the absorption layer 14 including 50 atomic % or more of a compound material prepared from among the first material group is excellent in transferability and hydrogen radical resistance, exhibits a reduced shadowing effect, has a long life and high transfer performance.

The following is a description of Examples of the reflective photomask blank and the reflective photomask according to Embodiment 2 of the present invention.

Example 2-1

As illustrated in FIG. 6, the multi-layer reflective film 12 formed by depositing 40 deposited layers each including a pair of silicon (Si) and molybdenum (Mo) is formed on the synthetic quartz substrate 11 having low thermal expansion characteristics. The film thickness of the multi-layer reflective film 12 was 280 nm.

Next, the capping layer 13 formed of ruthenium (Ru) as an intermediate film was film-formed on the multi-layer reflective film 12 so as to have a film thickness of 2.5 nm. This resulted in formation of the reflective portion 17 including the multi-layer reflective film 12 and the capping layer 13 on the substrate 11.

Then, the absorption layer 14 formed of a material in which indium oxide and germanium were homogenous at a ratio of 30:70 was film-formed on the capping layer 13 so as to have a film thickness of 47 nm. The atomic number ratio of indium to oxygen was 1:1.5 as measured by an X-ray photoelectron spectroscopy (XPS). Additionally, crystallinity of the absorption layer 14 was measured by an X-ray diffractometer (XRD) and found to be amorphous.

Next, the outermost layer 15 formed of tantalum oxide was film-formed on the absorption layer 14 so as to have a film thickness of 2 nm. This resulted in formation of the low reflective portion 18 including the absorption layer 14 and the outermost layer 15 on the reflective portion 17.

Then, the backside conductive film 16 formed of chromium nitride was film-formed with a thickness of 100 nm on the side of the substrate 11 not having the multi-layer reflective film 12 to produce the reflective photomask blank 100 of Example 2-1.

The film formation of each film on the substrate 11 was performed using a multi-source sputtering apparatus. The film thickness of each film was controlled by sputtering time.

Next, the method for producing the reflective photomask 200 is described with reference to FIGS. 7 to 11.

As illustrated in FIG. 7, a chemically amplified positive resist (SEBP 9012: manufactured by Shin-Etsu Chemical Co., Ltd.) was film-formed on the low reflective portion 18 of the reflective photomask blank 100 by spin coating to a film thickness of 120 nm, and baking was performed at 110° C. for 10 minutes to form the resist film 19.

Then, a predetermined pattern was drawn on the resist film 19 formed of the chemically amplified positive resist by an electron beam lithography system (JBX 3030: manufactured by JEOL Ltd). After that, baking treatment was performed at 110° C. for 10 minutes, followed by spray development (SFG 3000: manufactured by Sigma Meltec Ltd). This resulted in formation of the resist pattern 19*a*, as illustrated in FIG. 8.

Next, using the resist pattern 19*a* as an etching mask, the outermost layer 15 was patterned by dry etching mainly using a fluorine-based gas to form an outermost layer pattern in the outermost layer 15, as illustrated in FIG. 9.

Then, the absorption layer 14 was patterned by dry etching mainly using a chlorine-based gas to form an absorption pattern. As a result, the low reflective portion pattern 18*a* was formed, as illustrated in FIG. 10.

Subsequently, the remaining resist pattern 19*a* was peeled off to produce the reflective photomask 200 of the present Example, as illustrated in FIG. 11.

Next, the reflective photomask 200 of the present Example was immersed in sulfuric acid at 80° C. for 10 minutes, and then cleaned by being immersed in a cleaning bath filled with a cleaning solution prepared by mixing ammonia, hydrogen peroxide solution, and water at a ratio of 1:1:20 for 10 minutes and being washed with running water for 10 minutes using a 500 W megasonic cleaner. After that, the film thickness was measured by an atomic force microscope (AFM) and compared with the film thickness at the time of film formation, but no change was observed in the film thickness.

In the present Example, the low reflective portion pattern 18*a* formed in the low reflective portion 18 includes a line width 64 nm LS (line and space) pattern, a line width 200 nm LS pattern for measuring the film thickness of the absorption layer 14 using an AFM, and a 4 mm square low reflective portion removing portion for measuring EUV reflectance on the reflective photomask 200 for transfer evaluation. The line width 64 nm LS pattern was designed in each of an x-direction and a y-direction, as illustrated in FIG. 12, so that influence of the shadowing effect caused by oblique irradiation of EUV was easily visible.

Example 2-2

The absorption layer 14 was formed of a material in which indium oxide and germanium were homogenous at a ratio of 50:50, and was film-formed so as to have a film thickness of 47 nm. The atomic number ratio of indium to oxygen was 1:1.5 as measured by an X-ray photoelectron spectroscopy (XPS).

Next, the outermost layer 15 formed of tantalum oxide was film-formed on the absorption layer 14 so as to have a film thickness of 2 nm. As a result, the total film thickness of the low reflective portion 18 was 49 nm. Additionally, the reflective photomask blank 100 and the reflective photomask 200 of Example 2-2 were produced in the same manner as in Example 2-1 except for each film formation of the absorption layer 14 and the outermost layer 15.

Example 2-3

The absorption layer 14 was formed of a material in which indium oxide and germanium were homogenous at a ratio of 50:50, and was film-formed so as to have a film thickness of 33 nm. The atomic number ratio of indium to oxygen was 1:1.5 as measured by an X-ray photoelectron spectroscopy (XPS).

Next, the outermost layer 15 formed of tantalum oxide was film-formed on the absorption layer 14 so as to have a film thickness of 2 nm. As a result, the total film thickness of the low reflective portion 18 was 35 nm. Additionally, the reflective photomask blank 100 and the reflective photomask 200 of Example 2-3 were produced in the same manner as in Example 2-1 except for each film formation of the absorption layer 14 and the outermost layer 15.

Example 2-4

The absorption layer 14 was formed of indium oxide and film-formed so as to have a film thickness of 26 nm. The atomic number ratio of indium to oxygen was 1:1.5 as measured by an X-ray photoelectron spectroscopy (XPS).

Next, the outermost layer 15 formed of tantalum oxide was film-formed on the absorption layer 14 so as to have a film thickness of 2 nm. As a result, the total film thickness of the low reflective portion 18 was 28 nm. Additionally, the reflective photomask blank 100 and the reflective photomask 200 of Example 2-4 were produced in the same manner as in Example 2-1 except for each film formation of the absorption layer 14 and the outermost layer 15.

Example 2-5

The absorption layer 14 was formed of indium oxide and film-formed so as to have a film thickness of 26 nm. The atomic number ratio of indium to oxygen was 1:1.5 as measured by an X-ray photoelectron spectroscopy (XPS).

Next, the outermost layer 15 formed of bismuth (Bi) was film-formed on the absorption layer 14 so as to have a film thickness of 2 nm. As a result, the total film thickness of the low reflective portion 18 was 28 nm. Additionally, the reflective photomask blank 100 and the reflective photomask 200 of Example 2-5 were produced in the same manner as in Example 2-1 except for each film formation of the absorption layer 14 and the outermost layer 15.

Comparative Example 2-1

The absorption layer 14 was formed of indium oxide and film-formed so as to have a film thickness of 26 nm. The atomic number ratio of indium to oxygen was 1:1.5 as measured by an X-ray photoelectron spectroscopy (XPS). However, the outermost layer 15 was not formed. In addition, other than that, the reflective photomask blank 100 and the reflective photomask 200 of Comparative Example 2-1 were produced in the same manner as in Example 2-1.

Comparative Example 2-2

The absorption layer 14 was formed of tantalum nitride, and film-formed so as to have a film thickness of 58 nm. Additionally, the outermost layer 15 was formed of tantalum oxide, and film-formed so as to have a film thickness of 2 nm. The present Comparative Example assumes a conventional reflective photomask provided with an existing film containing tantalum as a main component. In addition, the reflective photomask blank 100 and the reflective photomask 200 of Comparative Example 2-2 were produced in the same manner as in Example 2-1 except for each film formation of the absorption layer 14 and the outermost layer 15.

The reflectance Rm in the reflective layer region and the reflectance Ra in the low reflective portion region of each of the reflective photomasks 200 produced in the above-described Examples and Comparative Examples were measured by a reflectance measuring device using EUV light. The reflectance Rm was measured at a 4 mm square absorption layer removing portion. From results of the measurement, the OD value was calculated using Equation (1) described above.

(Hydrogen Radical Resistance)

The reflective photomask 200 produced in each of Examples and Comparative Examples was placed in a hydrogen radical environment using microwave plasma in which the hydrogen pressure was 0.36 millibar (mbar) or less at a power of 1 kW. A change in the film thickness of the absorption layer 4 after the hydrogen radical treatment was confirmed using an AFM. The measurement was performed using the line width 200 nm LS pattern.

At this time, the hydrogen radical resistance was evaluated as "○" when the film reduction rate was 0.1 nm/s or less, and "◎" in the cases of particularly excellent results. Additionally, when although there was a film reduction of a few nm immediately after the start of the hydrogen radical treatment, the film reduction rate thereafter was 0.1 nm/s or less, it was evaluated as "Δ", and when the film reduction rate exceeded 0.1 nm/s in all the measurements, it was evaluated as "x". In addition, in the present Example, the evaluation of "○" or higher indicates no problem for use, and therefore was determined to be acceptable.

(Wafer Exposure Evaluation)

Using an EUV exposure system (NXE 3300B: manufactured by ASML Co., Ltd.), the low reflective portion pattern 18*a* of each reflective photomask 200 produced in Examples and Comparative Examples was transferred and exposed on a semiconductor wafer coated with a chemically amplified EUV positive resist. At this time, the amount of exposure was adjusted so that the LS pattern in the x-direction in FIG. 12 was transferred as designed. After that, observation and line width measurement of the transferred resist pattern were performed by an electron beam dimension measuring apparatus to confirm the resolution.

At this time, the HV-bias was marked with "A" for 7.3 nm in the existing film, "○" for less than 7.3 nm, and "◎" for 4.5 nm or less. The OD value was marked with "○" for 1.5 or more, and "◎" for 2 or more. In addition, the HV-bias evaluated as "Δ" or higher is not problematic for use, and therefore was determined to be acceptable. Furthermore, the OD value evaluated as "○" or higher is not problematic for use, and therefore was determined to be acceptable.

Table 4 shows results of these evaluations.

| | Absorption layer | | Outermost layer | | Low reflective portion | Mask characteristics | | |
|---|---|---|---|---|---|---|---|---|
| | Material | Film thickness | Material | Film thickness | Total film thickness | OD value | Pattern transferability | Hydrogen radical resistance |
| Ex. 2-1 | Indium oxide, Germanium (mixing ratio 30:70) | 47 nm | Tantalum oxide | 2 nm | 49 nm | ○ (1.73) | ○ (H-V bias 5.3 nm) | ◎ |
| Ex. 2-2 | Indium oxide, Germanium (mixing ratio 50:50) | 47 nm | Tantalum oxide | 2 nm | 49 nm | ◎ (2.33) | ○ (H-V bias 7.0 nm) | ◎ |
| Ex. 2-3 | Indium oxide, Germanium | 33 nm | Tantalum oxide | 2 nm | 35 nm | ○ (1.55) | ◎ (H-V bias 4.1 nm) | ◎ |

-continued

| | Absorption layer | | Outermost layer | | Low reflective portion | Mask characteristics | | |
|---|---|---|---|---|---|---|---|---|
| | Material | Film thickness | Material | Film thickness | Total film thickness | OD value | Pattern transferability | Hydrogen radical resistance |
| | (mixing ratio 50:50) | | | | | | | |
| Ex. 2-4 | Indium oxide | 26 nm | Tantalum oxide | 2 nm | 28 nm | ○ (1.77) | ○ (H-V bias 4.6 nm) | ◎ |
| Ex. 2-5 | Indium oxide | 26 nm | Bismuth | 2 nm | 28 nm | ○ (1.77) | ○ (H-V bias 4.6 nm) | ○ |
| Comp. Ex. 2-1 | Indium oxide | 26 nm | — | — | 26 nm | ○ (1.77) | ○ (H-V bias 4.6 nm) | Δ |
| Comp. Ex. 2-2 (existing film) | Tantalum nitride | 58 nm | Tantalum oxide | 2 nm | 60 nm | ○ (1.54) | Δ (H-V bias 7.3 nm) | ○ |

Comparative Example 2-2 in Table 4 shows mask characteristics and a resist pattern dimension on the wafer in the Ta-based existing film including the absorption layer 14 formed of tantalum nitride and having the film thickness of 58 nm and the outermost layer 15 formed of tantalum oxide and having the film thickness of 2 nm. In the reflective photomask 200 of Comparative Example 2-2, the OD value was 1.54, which provided a contrast allowing for pattern transfer. As a result of the patterning with EUV light, the H-V bias (horizontal-vertical dimensional difference) was 7.3 nm, where although the pattern was resolved, influence of the shadowing effect was significant, resulting in low transferability.

Example 2-1 in Table 4 shows mask characteristics and a resist pattern dimension on the wafer in the photomask including the absorption layer 14 formed of a material containing indium oxide and germanium (mixing ratio 30:70) and having the film thickness of 47 nm and the outermost layer 15 formed of tantalum oxide and having the film thickness of 2 nm. In the reflective photomask 200 of Example 2-1, no change in film thickness in response to hydrogen radicals was observed, which was a favorable result. The OD value was 1.73, which provided a contrast allowing for pattern transfer. As a result of the patterning with EUV light, the H-V bias was 5.3 nm, so that excellent pattern transferability was obtained compared with Comparative Example 2-2.

Example 2-2 in Table 4 shows mask characteristics and a resist pattern dimension on the wafer in the photomask including the absorption layer 14 formed of a material containing indium oxide and germanium (mixing ratio 50:50) and having the film thickness of 47 nm and the outermost layer 15 formed of tantalum oxide and having the film thickness of 2 nm. In the reflective photomask 200 of Example 2-2, no change in film thickness in response to hydrogen radicals was observed, which was a favorable result. The OD value was 2.33, so that a higher contrast was obtained than in Example 2-1. As a result of the patterning with EUV light, the H-V bias was 7.0 nm, which is a result that the shadowing effect was reduced and thereby the pattern transferability was able to be improved as compared with Comparative Example 2-2. However, the performance thereof is slightly inferior to that of Example 2-1.

Example 2-3 in Table 4 shows mask characteristics and a resist pattern dimension on the wafer in the photomask including the absorption layer 14 formed of a material containing indium oxide and germanium (mixing ratio 50:50) and having the film thickness of 33 nm and the outermost layer 15 formed of tantalum oxide and having the film thickness of 2 nm. In the reflective photomask 200 of Example 2-3, no change in film thickness in response to hydrogen radicals was observed, which was a favorable result. The OD value was 1.55, which provided a contrast allowing for pattern transfer. As a result of the patterning with EUV light, the H-V bias was 4.1 nm, which is a result that the shadowing effect was reduced and thereby the pattern transferability was able to be significantly improved as compared with Comparative Example 2-2. The thinner film was found to improve both the OD value and the H-V bias, as compared with Example 2-2.

Example 2-4 in Table 4 shows mask characteristics and a resist pattern dimension on the wafer in the photomask including the absorption layer 14 formed of indium oxide and having the film thickness of 26 nm and the outermost layer 15 formed of tantalum oxide and having the film thickness of 2 nm. In the reflective photomask 200 of Example 2-4, no change in film thickness in response to hydrogen radicals was observed. The OD value was 1.77, which provided a contrast allowing for pattern transfer. As a result of the patterning with EUV light, the H-V bias was 4.6 nm, indicating a result that the shadowing effect was reduced and thereby the pattern transferability was able to be significantly improved as compared with Comparative Example 2-2.

Example 2-5 in Table 4 shows mask characteristics and a resist pattern dimension on the wafer in the photomask including the absorption layer 14 formed of indium oxide and having the film thickness of 26 nm and the outermost layer 15 formed of bismuth (Bi) and having the film thickness of 2 nm. In the reflective photomask 200 of Example 2-5, no change in film thickness in response to hydrogen radicals was observed. The OD value was 1.77, which provided a contrast allowing for pattern transfer. As a result of the patterning with EUV light, the H-V bias was 4.6 nm, indicating a result that the shadowing effect was reduced and thereby the pattern transferability was able to be significantly improved as compared with Comparative Example 2-2.

Comparative Example 2-1 in Table 4 shows mask characteristics and a resist pattern dimension on the wafer when the absorption layer 14 was formed of indium oxide (O/In =1.5) and had the film thickness of 26 nm, while the outermost layer 15 was not formed. In the reflective photomask 200 of Comparative Example 2-1, the OD value was 1.77, so that sufficient contrast was obtained. As a result of the pattering with EUV light, the H-V bias was 4.6 nm, indicating high transferability. However, the evaluation of hydrogen radical resistance resulted in a film reduction of 1 nm immediately after the start of the hydrogen radical treatment, and after that, no film reduction was observed.

Comparing Examples 2-1 to 2-5 with the existing film (Comparative Example 2-2), the hydrogen radical resistance of each reflective photomask 200 of Examples 2-1 to 2-5 is equal to or higher than that of the reflective photomask using the existing film, so that the pattern transferability was able to be improved. Additionally, a comparison with Comparative Example 2-1 shows that when the low reflective portion 18 includes the outermost layer 15 formed of a hydrogen radical-resistant material as a main material, the hydrogen radical resistance of the photomask is improved further than the low reflective portion 18 formed only by the absorption layer 14.

Furthermore, in any of the reflective photomasks 200 of Examples 2-1 to 2-5 and Comparative Examples 2-1 to 2-2 given in Table 4, there was no change in film thickness between before and after the cleaning treatment, resulting in cleaning resistance.

These results show that the reflective photomasks 200 in which the outermost layer 15 is formed of a hydrogen radical-resistant material or the like is formed on the absorption layer 14 formed of a material having a high k value or the like are excellent in transferability and irradiation resistance, have a reduced shadowing effect, have a long life, and achieve high transfer performance. In other words, the reflective photomasks 200 provided with the outermost layer 15 formed including a hydrogen radical-resistant material on the absorption layer 14 formed including a material having a high k value suppress or reduce the shadowing effect and are resistant to hydrogen radicals.

INDUSTRIAL APPLICABILITY

The reflective photomask blank and the reflective photomask according to the present invention can be suitably used to form a fine pattern by EUV exposure in a process for manufacturing a semiconductor integrated circuit or the like.

REFERENCE SIGNS LIST

1: Substrate
2: Multi-layer reflective film
3: Capping layer
4: Absorption layer
5: Outermost layer
7: Reflective portion
8: Low reflective portion
**8*a***: Low reflective portion pattern
10: Reflective photomask blank
20: Reflective photomask
11: Substrate
12: Multi-layer reflective film
13: Capping layer
14: Absorption layer
15: Outermost layer
16: Backside conductive film
17: Reflective portion
18: Low reflective portion
**18*a***: Low reflective portion pattern
19: Resist film
**19*a***: Resist pattern
100: Reflective photomask blank
200: Reflective photomask
300: Chamber
301: Electrode
302: Sample

The invention claimed is:

1. A reflective photomask blank for producing a reflective photomask for pattern transfer using extreme ultraviolet light as a light source, the reflective photomask blank comprising:
- a substrate;
- a reflective portion formed on the substrate to reflect incident light; and
- a low reflective portion formed on the reflective portion to absorb the incident light,
- wherein the low reflective portion is a deposited structure of at least two or more layers including an absorption layer and an outermost layer, in which at least one layer of the absorption layer includes a total of 50 atomic % or more of one or more selected from a first material group, and the outermost layer includes a total of 80 atomic % or more of at least one or more selected from a second material group,
- the first material group includes tellurium (Te), cobalt (Co), copper (Cu), zinc (Zn), bismuth (Bi), and oxides, nitrides, and oxynitrides thereof, and
- the second material group includes tantalum (Ta), aluminum (Al), ruthenium (Ru), molybdenum (Mo), zirconium (Zr), titanium (Ti), zinc (Zn), vanadium (V), and oxides, nitrides, oxynitrides, and indium oxides ($In_xO_y$ ($y>1.5x$)) thereof.

2. The reflective photomask blank according to claim 1 wherein the low reflective portion has a film thickness of 60 nm or less,
- even when the absorption layer is divided into a plurality of layers, a total film thickness of each layer is from 17 nm to 47 nm, and
- the outermost layer has a film thickness of 1 nm or more.

3. The reflective photomask blank according to claim 2, wherein even when the absorption layer is divided into a plurality of layers, the total film thickness of each layer is from 17 nm to 45 nm.

4. The reflective photomask blank according to claim 1, wherein the total film thickness of the absorption layer is in a range of from 17 nm to 47 nm, and an optical density (OD) value is 1.0 or more.

5. A reflective photomask for pattern transfer using extreme ultraviolet light as a light source, the reflective photomask comprising:
- a substrate;
- a reflective portion formed on the substrate to reflect incident light; and
- a low reflective portion formed on the reflective portion to absorb the incident light,
- wherein the low reflective portion is a deposited structure of at least two or more layers including an absorption layer and an outermost layer, in which at least one layer of the absorption layer includes a total of 50 atomic % or more of one or more selected from a first material group, and the outermost layer includes a total of 80 atomic % or more of at least one or more selected from a second material group,
- the first material group includes tellurium (Te), cobalt (Co), copper (Cu), zinc (Zn), bismuth (Bi), and oxides, nitrides, and oxynitrides thereof, and the second material group includes tantalum (Ta), aluminum (Al), ruthenium (Ru), molybdenum (Mo), zirconium (Zr), titanium (Ti), zinc (Zn), vanadium (V), and oxides, nitrides, oxynitrides, and indium oxides ($In_xO_y$ (y>1.5x)) thereof.

6. The reflective photomask according to claim 5, wherein the low reflective portion has a film thickness of 60 nm or less, even when the absorption layer is divided into a plurality of layers, a total film thickness of each layer is from 17 nm to 47 nm, and the outermost layer has a film thickness of 1 nm or more.

7. The reflective photomask according to claim 6, wherein even when the absorption layer is divided into a plurality of layers, the total film thickness of each layer is from 17 nm to 45 nm.

* * * * *